(12) United States Patent  (10) Patent No.: US 7,589,820 B2
Nei et al.  (45) Date of Patent: *Sep. 15, 2009

(54) EXPOSURE APPARATUS AND METHOD FOR PRODUCING DEVICE

(75) Inventors: Masahiro Nei, Yokohama (JP); Naoyuki Kobayashi, Fukaya (JP); Dai Arai, Kita-ku (JP); Soichi Owa, Kumagaya (JP)

(73) Assignee: Nikon Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/473,147

(22) Filed: Jun. 23, 2006

(65) Prior Publication Data

US 2006/0238730 A1   Oct. 26, 2006

Related U.S. Application Data

(60) Division of application No. 11/141,090, filed on Jun. 1, 2005, which is a continuation of application No. PCT/JP03/015666, filed on Dec. 8, 2003.

(30) Foreign Application Priority Data

Dec. 10, 2002 (JP) .............................. 2002-357958
Aug. 20, 2003 (JP) .............................. 2003-296491

(51) Int. Cl.
G03B 27/42 (2006.01)
G03B 27/52 (2006.01)
G03B 27/58 (2006.01)
G03B 27/32 (2006.01)

(52) U.S. Cl. .............................. 355/53; 355/30; 355/72; 355/77

(58) Field of Classification Search .................. 355/30, 355/53, 72, 77; 430/322
See application file for complete search history.

(56) References Cited

U.S. PATENT DOCUMENTS 4,346,164 A   8/1982   Tabarelli et al.
4,480,910 A   11/1984  Takanashi et al.
5,610,683 A   3/1997   Takahashi
5,715,039 A   2/1998   Fukuda et al.

(Continued)

FOREIGN PATENT DOCUMENTS

DE   221 563 A1   4/1985

(Continued)

OTHER PUBLICATIONS

English Translation of JP 10-340846 (dated Dec. 22, 1998).*

(Continued)

*Primary Examiner*—Alan A Mathews
(74) *Attorney, Agent, or Firm*—Oliff & Berridge, PLC

(57) ABSTRACT

An exposure apparatus exposes a substrate P by locally filling a side of an image plane of a projection optical system PL with a liquid 50 and projecting an image of a pattern onto the substrate P through the liquid 50 and the projection optical system PL. The exposure apparatus includes a recovery unit 20 which recovers the liquid 50 outflowed to the outside of the substrate P. When the exposure process is performed in accordance with the liquid immersion method, the pattern can be transferred accurately while suppressing any environmental change even when the liquid outflows to the outside of the substrate.

18 Claims, 13 Drawing Sheets

U.S. PATENT DOCUMENTS

| | | | |
|---|---|---|---|
| 5,825,043 | A | 10/1998 | Suwa |
| 6,033,475 | A | 3/2000 | Hasebe et al. |
| 2002/0163629 | A1 | 11/2002 | Switkes et al. |
| 2003/0030916 | A1 | 2/2003 | Suenaga |
| 2003/0174408 | A1 | 9/2003 | Rostalski et al. |
| 2004/0000627 | A1 | 1/2004 | Schuster |
| 2004/0075895 | A1 | 4/2004 | Lin |
| 2004/0109237 | A1 | 6/2004 | Epple et al. |
| 2004/0114117 | A1 | 6/2004 | Bleeker |
| 2004/0118184 | A1 | 6/2004 | Violette |
| 2004/0125351 | A1 | 7/2004 | Krautschik |
| 2004/0136494 | A1 | 7/2004 | Lof et al. |
| 2004/0160582 | A1 | 8/2004 | Lof et al. |
| 2004/0165159 | A1 | 8/2004 | Lof et al. |
| 2004/0169834 | A1 | 9/2004 | Richter et al. |
| 2004/0169924 | A1 | 9/2004 | Flagello et al. |
| 2004/0180294 | A1 | 9/2004 | Baba-Ali et al. |
| 2004/0180299 | A1 | 9/2004 | Rolland et al. |
| 2004/0207824 | A1 | 10/2004 | Lof et al. |
| 2004/0211920 | A1 | 10/2004 | Maria Derksen et al. |
| 2004/0224265 | A1 | 11/2004 | Endo et al. |
| 2004/0224525 | A1 | 11/2004 | Endo et al. |
| 2004/0227923 | A1 | 11/2004 | Flagello et al. |
| 2004/0253547 | A1 | 12/2004 | Endo et al. |
| 2004/0253548 | A1 | 12/2004 | Endo et al. |
| 2004/0257544 | A1 | 12/2004 | Vogel et al. |
| 2004/0259008 | A1 | 12/2004 | Endo et al. |
| 2004/0259040 | A1 | 12/2004 | Endo et al. |
| 2004/0263808 | A1 | 12/2004 | Sewell |
| 2005/0030506 | A1 | 2/2005 | Schuster |
| 2005/0036121 | A1 | 2/2005 | Hoogendam et al. |
| 2005/0036183 | A1 | 2/2005 | Yeo et al. |
| 2005/0036184 | A1 | 2/2005 | Yeo et al. |
| 2005/0036213 | A1 | 2/2005 | Mann et al. |
| 2005/0037269 | A1 | 2/2005 | Levinson |
| 2005/0046934 | A1 | 3/2005 | Ho et al. |
| 2005/0048223 | A1 | 3/2005 | Pawloski et al. |
| 2005/0068639 | A1 | 3/2005 | Pierrat et al. |
| 2005/0073670 | A1 | 4/2005 | Carroll |
| 2005/0084794 | A1 | 4/2005 | Meagley et al. |
| 2005/0094116 | A1 | 5/2005 | Flagello et al. |
| 2005/0100745 | A1 | 5/2005 | Lin et al. |
| 2005/0110973 | A1 | 5/2005 | Streefkerk et al. |
| 2005/0117224 | A1 | 6/2005 | Shafer et al. |
| 2005/0122497 | A1 | 6/2005 | Lyons et al. |
| 2005/0134815 | A1 | 6/2005 | Van Santen et al. |
| 2005/0141098 | A1 | 6/2005 | Schuster |
| 2005/0190455 | A1 | 9/2005 | Rostalski et al. |
| 2005/0217135 | A1 | 10/2005 | O'Donnell et al. |
| 2005/0217137 | A1 | 10/2005 | Smith et al. |
| 2005/0217703 | A1 | 10/2005 | O'Donnell |
| 2005/0231694 | A1 | 10/2005 | Kolesnychenko et al. |
| 2006/0023182 | A1* | 2/2006 | Novak et al. .......... 355/53 |

FOREIGN PATENT DOCUMENTS

| | | |
|---|---|---|
| DE | 224 448 A1 | 7/1985 |
| EP | 0 605 103 A1 | 7/1994 |
| EP | 0 834 773 A2 | 4/1998 |
| EP | 1 420 298 A2 | 5/2004 |
| EP | 1 420 299 A2 | 5/2004 |
| EP | 1 429 188 A2 | 6/2004 |
| EP | 1 624 481 A1 | 2/2006 |
| EP | 1 628 161 A2 | 2/2006 |
| EP | 1 699 073 A1 | 9/2006 |
| EP | 1 727 188 A1 | 11/2006 |
| JP | A-57-153433 | 9/1982 |
| JP | A-58-202448 | 11/1983 |
| JP | A-59-19912 | 2/1984 |
| JP | A 62-065326 | 3/1987 |
| JP | A 63-157419 | 6/1988 |
| JP | A-4-305915 | 10/1992 |
| JP | A-4-305917 | 10/1992 |
| JP | A-5-62877 | 3/1993 |
| JP | A 05-304072 | 11/1993 |
| JP | A 06-124873 | 5/1994 |
| JP | A 06-168866 | 6/1994 |
| JP | A 06-181157 | 6/1994 |
| JP | A-7-132262 | 5/1995 |
| JP | A 07-220990 | 8/1995 |
| JP | A-8-316125 | 11/1996 |
| JP | A 10-116760 | 5/1998 |
| JP | A 10-154659 | 6/1998 |
| JP | A 10-255319 | 9/1998 |
| JP | A 10-303114 | 11/1998 |
| JP | 10-340846 | * 12/1998 |
| JP | A 10-340846 | 12/1998 |
| JP | A 11-166990 | 6/1999 |
| JP | A 11-176727 | 7/1999 |
| JP | A 2000-058436 | 2/2000 |
| WO | WO 99/49504 | 9/1999 |
| WO | WO99/49504 | 9/1999 |
| WO | WO 02/091078 A1 | 11/2002 |
| WO | WO 03/077037 A1 | 9/2003 |
| WO | WO 2004/019128 A2 | 3/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/077154 A2 | 9/2004 |
| WO | WO 2004/081666 A1 | 9/2004 |
| WO | WO 2004/090577 A2 | 10/2004 |
| WO | WO 2004/090633 A2 | 10/2004 |
| WO | WO 2004/090634 A2 | 10/2004 |
| WO | WO 2004/092830 A2 | 10/2004 |
| WO | WO 2004/092833 A2 | 10/2004 |
| WO | WO 2004/093130 A2 | 10/2004 |
| WO | WO 2004/093159 A2 | 10/2004 |
| WO | WO 2004/093160 A2 | 10/2004 |
| WO | WO 2004/095135 A2 | 11/2004 |
| WO | WO 2005/001432 A2 | 1/2005 |
| WO | WO 2005/003864 A2 | 1/2005 |
| WO | WO 2005/006026 A2 | 1/2005 |
| WO | WO 2005/008339 A2 | 1/2005 |
| WO | WO 2005/013008 A2 | 2/2005 |
| WO | WO 2005/015283 A1 | 2/2005 |
| WO | WO 2005/017625 A2 | 2/2005 |
| WO | WO 2005/019935 A2 | 3/2005 |
| WO | WO 2005/022266 A2 | 3/2005 |
| WO | WO 2005/024325 A2 | 3/2005 |
| WO | WO 2005/024517 A2 | 3/2005 |
| WO | WO 2005/034174 A2 | 4/2005 |
| WO | WO 2005/054953 A2 | 6/2005 |
| WO | WO 2005/054955 A2 | 6/2005 |
| WO | WO 2005/062128 A2 | 7/2005 |

OTHER PUBLICATIONS

Emerging Lithographic Technologies VI, Proceedings of SPIE, vol. 4688 (2002), "Semiconductor Foundry, Lithography, and Partners", B.J. Lin, pp. 11-24.

Optical Microlithography XV, Proceedings of SPIE, vol. 4691 (2002), "Resolution Enhancement of 157 nm Lithography by Liquid Immersion", M. Switkes et al., pp. 459-465.

J. Microlith., Microfab., Microsyst., vol. 1 No. 3, Oct. 2002, Society of Photo-Optical Instrumentation Engineers, "Resolution enhancement of 157 nm lithography by liquid immersion", M. Switkes et al., pp. 1-4.

Nikon Corporation, Litho Forum, Jan. 28, 2004, "Update on 193 nm immersion exposure tool", S. Owa et al., 51 pages (slides 1-51).

Nikon Corporation, Immersion Lithography Workshop, Dec. 11, 2002, 24 pages (slides 1-24).

Nikon Corporation, Immersion Workshop, Jan. 27, 2004, "Update on 193 nm immersion exposure tool", S. Owa et al., 38 pages (slides 1-38).

Nikon Corporation, 3$^{rd}$ 157 nm symposium, Sep. 4, 2002, "Nikon F2 Exposure Tool", Soichi Owa et al., 25 pages (slides 1-25).

Optical Microlithography XVI, Proceedings of SPIE vol. 5040 (2003), "Immersion lithography; its potential performance and issues", Soichi Owa et al., pp. 724-733.

Nikon Corporation, NGL Workshop, Jul. 10, 2003, :Potential performance and feasibility of immersion lithography, Soichi Owa et al., 33 pages, slides 1-33.

* cited by examiner

Fig. 9
(a)
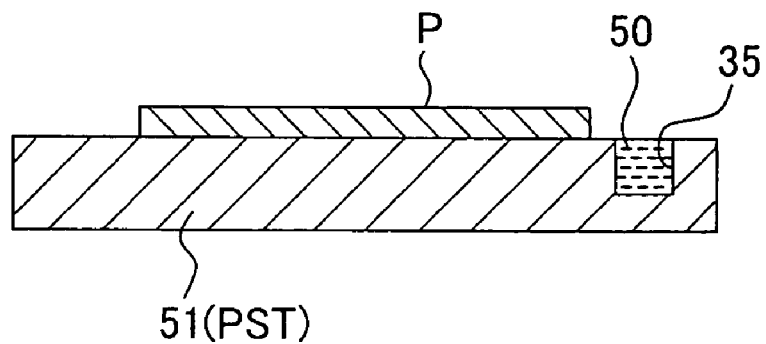
(b)
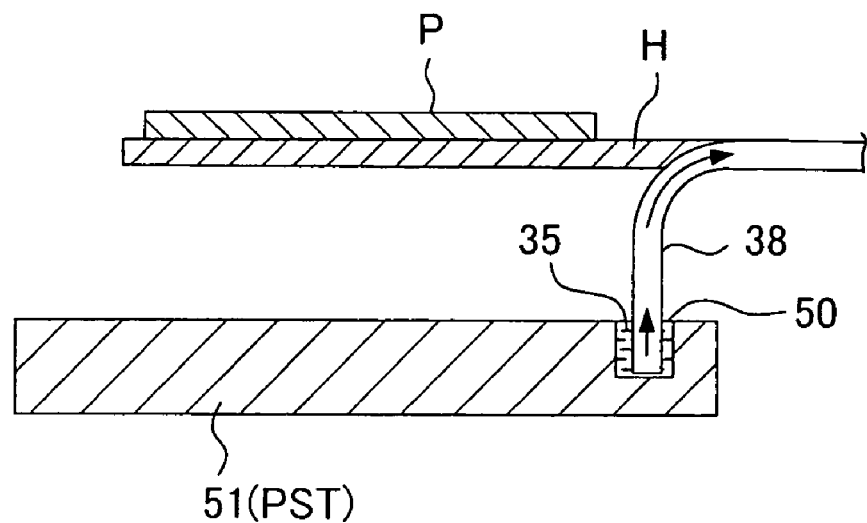

Fig. 10
(a)
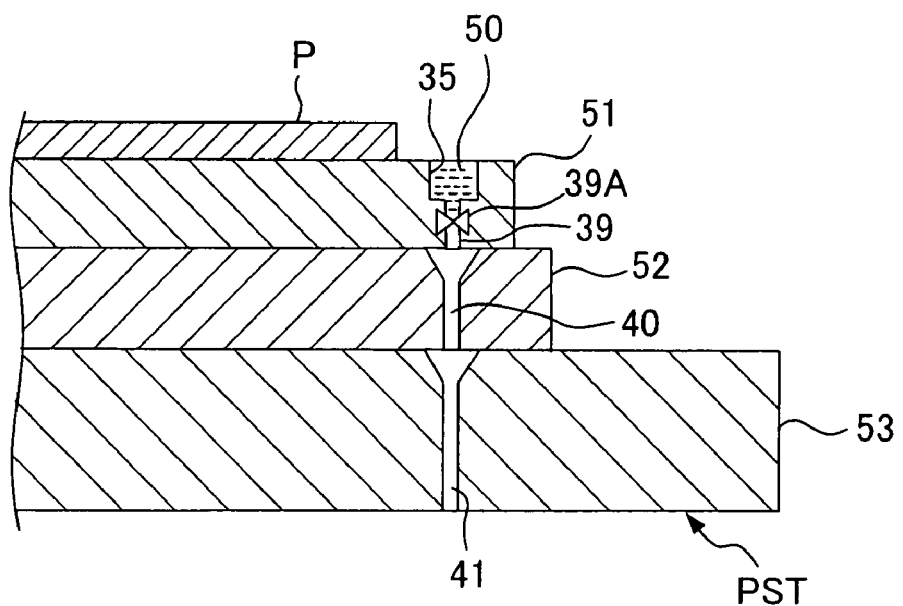
(b)
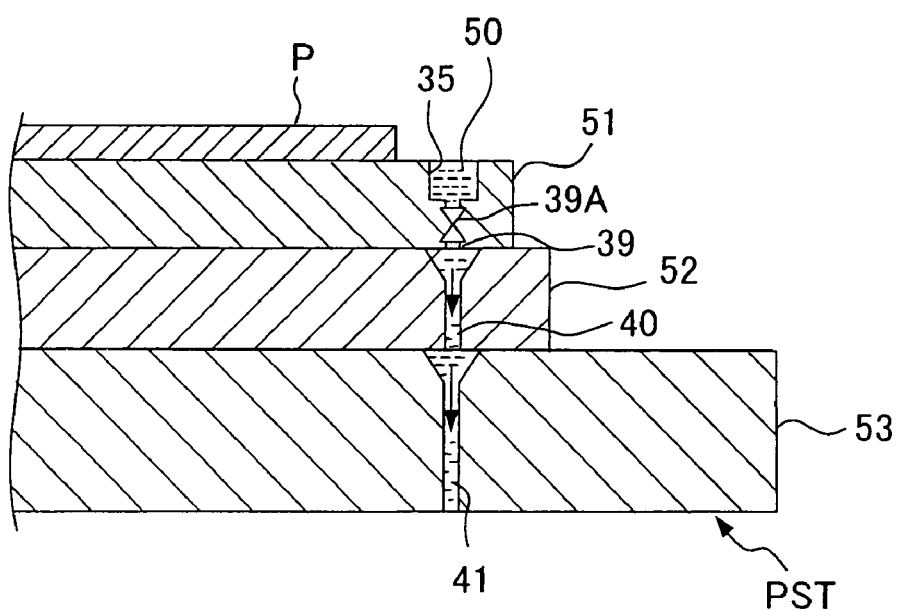

EXPOSURE APPARATUS AND METHOD FOR PRODUCING DEVICE

CROSS-REFERENCE

This is a Division of U.S. patent application Ser. No. 11/141,090 filed Jun. 1, 2005, which in turn is a Continuation of International Application No. PCT/JP03/015666 filed Dec. 8, 2003 claiming the conventional priority of Japanese patent Application Nos. 2002-357958 filed on Dec. 10, 2002 and 2003-296491 filed on Aug. 20, 2003. The disclosures of these prior applications are incorporated by reference in their entireties.

BACKGROUND OF THE INVENTION

1. Field of the Invention

The present invention relates to an exposure apparatus for performing the exposure with an image of a pattern projected by a projection optical system in a state in which a space on a side of an image plane of the projection optical system is locally filled with a liquid. The present invention also relates to a method for producing a device by using the exposure apparatus.

2. Description of the Related Art

Semiconductor devices and liquid crystal display devices are produced with the so-called photolithography technique in which a pattern formed on a mask is transferred onto a photosensitive substrate. The exposure apparatus, which is used in the photolithography step, includes a mask stage for supporting the mask and a substrate stage for supporting the substrate. The pattern on the mask is transferred onto the substrate via a projection optical system while successively moving the mask stage and the substrate stage. In recent years, it is demanded to realize the higher resolution of the projection optical system in order to respond to the further advance of the higher integration of the device pattern. As the exposure wavelength to be used is shorter, the resolution of the projection optical system becomes higher. As the numerical aperture of the projection optical system is larger, the resolution of the projection optical system becomes higher. Therefore, the exposure wavelength, which is used for the exposure apparatus, is shortened year by year, and the numerical aperture of the projection optical system is increased as well. The exposure wavelength, which is dominantly used at present, is 248 nm of the KrF excimer laser. However, the exposure wavelength of 193 nm of the ArF excimer laser, which is shorter than the above, is also practically used in some situations. When the exposure is performed, the depth of focus (DOF) is also important in the same manner as the resolution. The resolution R and the depth of focus δ are represented by the following expressions respectively.

$$R = k_1 \cdot \lambda / NA \quad (1)$$

$$\delta = \pm k_2 \cdot / NA^2 \quad (2)$$

In the expressions, $\lambda$ represents the exposure wavelength, NA represents the numerical aperture of the projection optical system, and $k_1$ and $k_2$ represent the process coefficients. According to the expressions (1) and (2), the following fact is appreciated. That is, when the exposure wavelength $\lambda$ is shortened and the numerical aperture NA is increased in order to enhance the resolution R, then the depth of focus $\delta$ is narrowed.

If the depth of focus $\delta$ is too narrowed, it is difficult to match the substrate surface with respect to the image plane of the projection optical system. It is feared that the margin is insufficient during the exposure operation. Accordingly, the liquid immersion method has been suggested, which is disclosed, for example, in International Publication No. 99/49504 as a method for substantially shortening the exposure wavelength and widening the depth of focus. In this liquid immersion method, the space between the lower surface of the projection optical system and the substrate surface is filled with a liquid such as water or any organic solvent to utilize the fact that the wavelength of the exposure light beam in the liquid is 1/n as compared with that in the air (n represents the refractive index of the liquid, which is about 1.2 to 1.6 in ordinary cases) so that the resolution is improved and the depth of focus is magnified about n times.

The conventional technique as described above involves the following problem. The conventional technique is constructed such that the space, which is disposed between the substrate (wafer) and the lower surface on the side of the image plane of the projection optical system, is locally filled with the liquid. When a shot area, which is positioned in the vicinity of the center of the substrate, is subjected to the exposure, the liquid does not outflow to the outside of the substrate. However, as schematically shown in FIG. 14, when it is intended to expose an edge area E of the substrate P by moving the circumferential area (edge area) E of the substrate P to the projection area 100 of the projection optical system, the liquid outflows to the outside of the substrate P. If the outflowed liquid is left to stand, the environment (for example, humidity), in which the substrate P is placed, is consequently varied to cause, for example, the change of the refractive index on the optical path of the interferometer for measuring the position information about the substrate stage for holding the substrate P and/or on the optical path of the detecting light beam of each of various optical detecting devices. As a result, it is feared that any desired pattern transfer accuracy cannot be obtained. Further, an inconvenience also arises, for example, such that any rust appears due to the outflowed fluid on mechanical parts or the like arranged around the substrate stage for supporting the substrate P. It is also conceived that the liquid is prevented from any outflow by omitting the exposure for the edge area E of the substrate P. However, if the pattern is not formed by applying the exposure process to the edge area E as well, another problem arises as follows. That is, the substrate P as the wafer abuts against the polishing surface of the CMP apparatus in an unbalanced manner, for example, in the CMP (chemical mechanical polishing) process as the downstream step, and it is impossible to perform any satisfactory polishing. Further, if the outflowed liquid makes inflow into the tube of the vacuum system (suction system), it is also feared that the vacuum pump, which serves as the vacuum source, may be damaged or broken down.

SUMMARY OF THE INVENTION

The present invention has been made taking the foregoing circumstances into consideration, an object of which is to provide an exposure apparatus and an exposure method in which a pattern can be transferred accurately when an exposure process is performed while filling a space between a projection optical system and a substrate with a liquid, and a method for producing a device in which the exposure apparatus is used.

In order to achieve the object as described above, the present invention adopts the following constructions.

According to a first aspect of the present invention, there is provided an exposure apparatus for exposing a substrate by transferring an image of a pattern through a liquid onto the substrate, comprising:

a projection optical system which projects the image of the pattern onto the substrate; and a recovery unit which recovers the liquid outflowed to outside of the substrate.

According to the present invention, even when the liquid outflows to the outside of the substrate, then the outflowed liquid is recovered by the recovery unit without being left to stand. Therefore, the variation of the environment in which the substrate is placed is suppressed. Further, the occurrence of the inconvenience is also suppressed, which would be otherwise caused such that any rust or the like appears on mechanical parts disposed around the substrate stage for supporting the substrate. Therefore, it is possible to accurately transfer the pattern to the substrate, and it is possible to produce a device having a high pattern accuracy.

According to a second aspect of the present invention, there is provided an exposure apparatus for exposing a substrate by transferring an image of a pattern through a liquid onto the substrate, comprising:

a projection optical system which projects the image of the pattern onto the substrate;

a liquid supply mechanism which supplies the liquid above the substrate; and a recovery unit which recovers the liquid supplied from the liquid supply mechanism, wherein the recovery unit does not perform the recovering above the substrate.

According to the present invention, the liquid can be recovered (sucked) without performing the recovery (suction) above the substrate (from above the substrate). Therefore, it is possible to avoid the occurrence of the sound and the vibration during the exposure for the substrate. Further, the liquid, which outflows to the outside of the substrate, is recovered by the recovery unit. Therefore, it is possible to avoid the variation of the environment in which the substrate is placed and the occurrence of any rust or the like on mechanical parts. Therefore, it is possible to accurately form the pattern on the substrate, and it is possible to produce a device having a high pattern accuracy.

According to a third aspect of the present invention, there is provided an exposure apparatus for exposing a substrate by transferring an image of a pattern through a liquid onto the substrate, comprising:

a projection optical system which projects the image of the pattern onto the substrate;

a suction system which has a suction port; and a recovery unit which recovers the liquid sucked through the suction port.

According to the present invention, for example, even when the liquid outflows, and the liquid inflows into the suction port of the suction system, then the liquid is recovered, and the vacuum source, which serves as the source of the suction, is prevented from any inflow of the liquid. Therefore, even when the liquid immersion exposure is performed, the function of the suction system is guaranteed. It is possible to produce a device by reliably exposing the substrate with the highly accurate pattern.

According to a fourth aspect of the present invention, there is provided an exposure apparatus for exposing a substrate by transferring an image of a pattern through a liquid onto the substrate, comprising:

a projection optical system which projects the image of the pattern onto the substrate;

a substrate stage which holds the substrate; and a recovery unit which recovers the liquid and at least a part of which is provided on the substrate stage. The exposure apparatus of the present invention makes it possible to avoid the variation of the environment in which the substrate is placed and the occurrence of any rust or the like of mechanical parts.

According to a fifth aspect of the present invention, there is provided an exposure method for exposing a substrate by transferring an image of a predetermined pattern onto the substrate with a projection optical system, comprising:

supplying a liquid above the substrate to a space between the projection optical system and the substrate;

recovering the supplied liquid from a position which is outside the substrate and which is lower than that of the substrate; and exposing the substrate during a period in which the liquid is supplied and recovered.

In the exposure method of the present invention, the liquid is supplied above the substrate, and the liquid is recovered below the position at which the substrate is held when the liquid immersion exposure is performed. Therefore, it is possible to effectively avoid the occurrence of the sound and the vibration during the exposure of the substrate.

According to still another aspect of the present invention, there is provided a method for producing a device by using the exposure apparatus according to any one of the first to fourth aspects described above.

BRIEF DESCRIPTION OF THE DRAWINGS

FIGS. 9A and 9B show schematic sectional views illustrating still another embodiment of a recovery unit.

FIGS. 10A and 10B show schematic sectional views illustrating still another embodiment of a recovery unit.

DESCRIPTION OF THE PREFERRED EMBODIMENTS OF THE INVENTION

Figure 1:
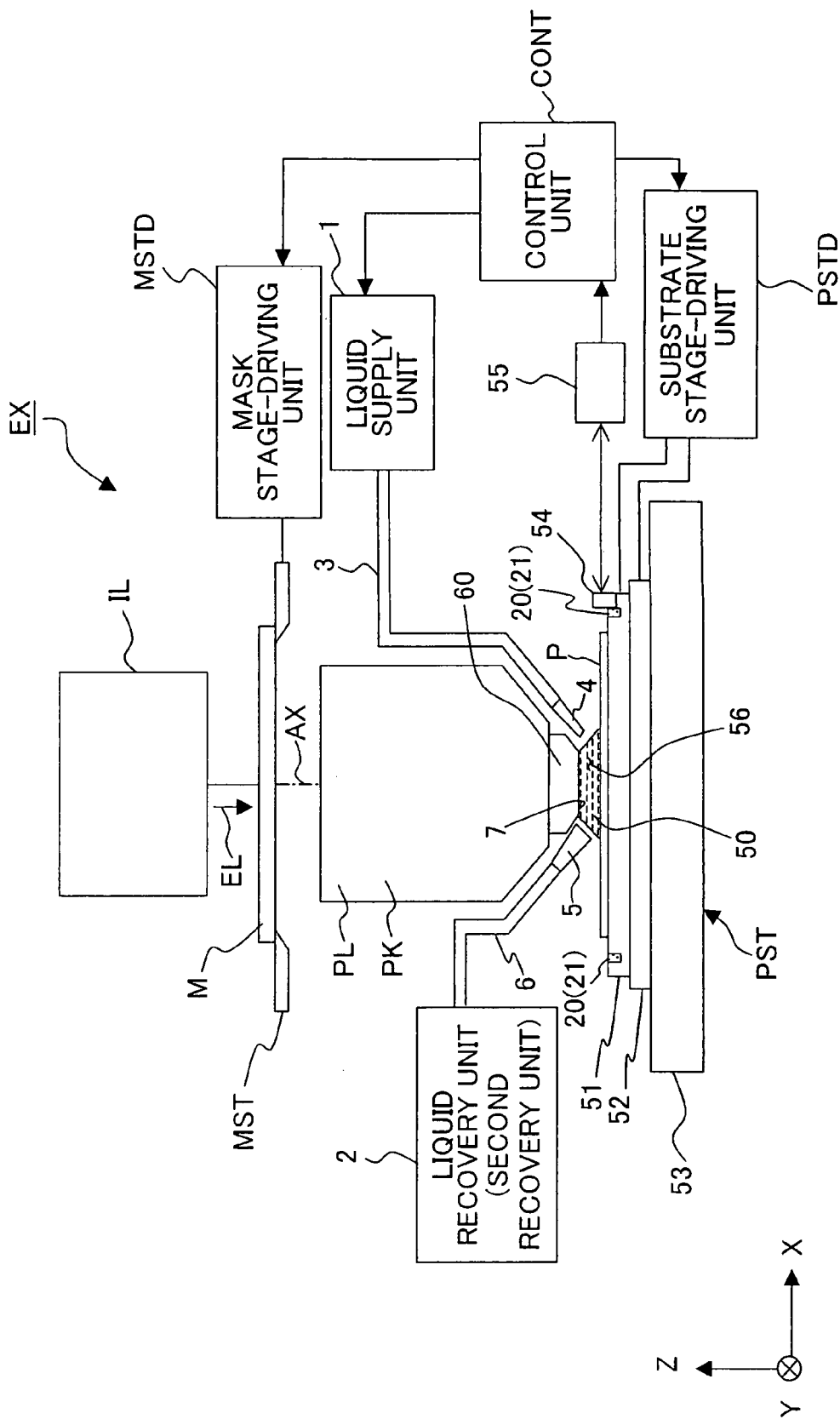
FIG. 1 shows a schematic arrangement illustrating an embodiment of the exposure apparatus of the present invention.

An explanation will be made below about the exposure apparatus and the method for producing the device according to the present invention with reference to the drawings. However, the present invention is not limited thereto. FIG. 1 shows a schematic arrangement illustrating an embodiment of the exposure apparatus of the present invention.

First Embodiment

With reference to FIG. 1, an exposure apparatus EX includes a mask stage MST which supports a mask M, a substrate stage PST which supports a substrate P, an illumination optical system IL which illuminates, with an exposure light beam EL, the mask M supported by the mask stage MST, a projection optical system PL which performs projection exposure for the substrate P supported by the substrate stage PST with an image of a pattern of the mask M illuminated with the exposure light beam EL, a liquid supply unit 1 which supplies a liquid 50 onto the substrate P, a recovery unit 20 which recovers the liquid 50 outflowed to the outside of the substrate P, and a control unit CONT which collectively controls the overall operation of the exposure apparatus EX.

The embodiment of the present invention will now be explained as exemplified by a case of the use of the scanning type exposure apparatus (so-called scanning stepper) as the exposure apparatus EX in which the substrate P is exposed with the pattern formed on the mask M while synchronously moving the mask M and the substrate P in mutually different directions (opposite directions) in the scanning directions. In the following explanation, the Z axis direction is the direction which is coincident with the optical axis AX of the projection optical system PL, the X axis direction is the synchronous movement direction (scanning direction) for the mask M and the substrate P in the plane perpendicular to the Z axis direction, and the Y axis direction is the direction (non-scanning direction) perpendicular to the Z axis direction and the Y axis direction. The directions about the X axis, the Y axis, and the Z axis are designated as θX, θY, and θZ directions respectively. The term "substrate" referred to herein includes those obtained by applying a resist on a semiconductor wafer, and the term "mask" includes a reticle formed with a device pattern subjected to the reduction projection onto the substrate.

The illumination optical system IL is used so that the mask M, which is supported on the mask stage MST, is illuminated with the exposure light beam EL. The illumination optical system IL includes, for example, an exposure light source, an optical integrator which uniformizes the illuminance of the light flux radiated from the exposure light source, a condenser lens which collects the exposure light beam EL supplied from the optical integrator, a relay lens system, and a variable field diaphragm which sets the illumination area on the mask M illuminated with the exposure light beam EL to be slit-shaped. The predetermined illumination area on the mask M is illuminated with the exposure light beam EL having a uniform illuminance distribution with the illumination optical system IL. Those usable as the exposure light beam EL radiated from the illumination optical system IL include, for example, emission lines (g-ray, h-ray, i-ray) in the ultraviolet region radiated, for example, from a mercury lamp, far ultraviolet light beams (DUV light beams) such as the KrF excimer laser beam (wavelength: 248 nm), and vacuum ultraviolet light beams (VUV light beams) such as the ArF excimer laser beam (wavelength: 193 nm) and the $F_2$ laser beam (wavelength: 157 nm). In this embodiment, the ArF excimer laser beam is used.

The mask stage MST supports the mask M. The mask stage MST is two-dimensionally movable in the plane perpendicular to the optical axis AX of the projection optical system PL, i.e., in the XY plane, and it is finely rotatable in the θZ direction. The mask stage MST is driven by a mask stage-driving unit MSTD such as a linear motor. The mask stage-driving unit MSTD is controlled by the control unit CONT. The position in the two-dimensional direction and the angle of rotation of the mask M on the mask stage MST are measured in real-time by a laser interferometer. The result of the measurement is outputted to the control unit CONT. The control unit CONT drives the mask stage-driving unit MSTD on the basis of the result of the measurement obtained by the laser interferometer to thereby position the mask M supported on the mask stage MST.

The projection optical system PL projects the pattern on the mask M onto the substrate P at a predetermined projection magnification β to perform the exposure. The projection optical system PL includes a plurality of optical elements (lenses). The optical elements are supported by a barrel PK as a metal member. In this embodiment, the projection optical system PL is a reduction system having the projection magnification β which is, for example, ¼ or ⅕. The projection optical system PL may be any one of the 1× magnification system and the magnifying system. The optical element (lens) 60 is exposed from the barrel PK on the side of the tip (on the side of the substrate P) of the projection optical system PL of this embodiment. The optical element 60 is provided detachably (exchangeably) with respect to the barrel PK.

The substrate stage PST supports the substrate P. The substrate stage PST includes a Z stage 51 which holds the substrate P by the aid of a substrate holder, an XY stage 52 which supports the Z stage 51, and a base 53 which supports the XY stage 52. The substrate stage PST is driven by a substrate stage-driving unit PSTD such as a linear motor. The substrate stage-driving unit PSTD is controlled by the control unit CONT. By driving the Z stage 51, the substrate P, which is held on the Z stage 51, is subjected to the control of the position (focus position) in the Z axis direction and the positions in the θX and θY directions. By driving the XY stage 52, the substrate P is subjected to the control of the position in the XY directions (position in the directions substantially parallel to the image plane of the projection optical system PL). That is, the Z stage 51 controls the focus position and the angle of inclination of the substrate P so that the surface of the substrate P is adjusted to match the image plane of the projection optical system PL in accordance with the autofocus system and the autoleveling system. The XY stage 52 positions the substrate P in the X axis direction and the Y axis direction. It goes without saying that the Z stage and the XY stage may be provided as an integrated body.

A movement mirror 54, which is movable together with the substrate stage PST with respect to the projection optical system PL, is provided on the substrate stage PST (Z stage 51). A laser interferometer 55 is provided at a position opposed to the movement mirror 54. The angle of rotation and the position in the two-dimensional direction of the substrate P on the substrate stage PST are measured in real-time by the laser interferometer 55. The result of the measurement is outputted to the control unit CONT. The control unit CONT drives the substrate stage-driving unit PSTD on the basis of the result of the measurement of the laser interferometer 55 to thereby position the substrate P supported on the substrate stage PST.

In this embodiment, the liquid immersion method is applied in order that the resolution is improved by substantially shortening the exposure wavelength and the depth of focus is substantially widened. Therefore, the space between the surface of the substrate P and the tip surface (lower surface) 7 of the optical element (lens) 60 of the projection optical system PL on the side of the substrate P is filled with the predetermined liquid 50 at least during the period in which the image of the pattern on the mask M is transferred onto the substrate P. As described above, the lens 60 is exposed on the tip side of the projection optical system PL, and the liquid 50 is supplied to make contact with only the lens 60. Accordingly, the barrel PK composed of the metal is prevented from any corrosion or the like. Further, the tip surface 7 of the lens 60 is sufficiently smaller than the substrate P and the barrel PK of the projection optical system PL, so that the liquid 50 is allowed to make contact with only the lens 60 as described above. Therefore, the side of the image plane of the projection optical system PL is locally filled with the liquid 50. That is, the liquid immersion portion, which is disposed between the projection optical system PL and the substrate P, is sufficiently smaller than the substrate P. In this embodiment, pure water is used for the liquid 50. The exposure light beam EL, which is not limited to only the ArF excimer laser beam, can be transmitted through pure water, even when the exposure light beam EL is, for example, the emission line (g-ray, h-ray, i-ray) in the ultraviolet region radiated, for example, from a mercury lamp or the far ultraviolet light beam (DUV light beam) such as the KrF excimer laser beam (wavelength: 248 nm).

The exposure apparatus EX includes a liquid supply unit 1 which supplies the predetermined liquid 50 to the space 56 between the substrate P and the tip surface (end surface of the lens 60) 7 of the projection optical system PL, and a liquid recovery unit 2 as a second recovery unit which recovers the liquid 50 from the space 56, i.e., the liquid 50 on the substrate P. The liquid supply unit 1 is provided to locally fill the side of the image plane of the projection optical system PL with the liquid 50. The liquid supply unit 1 includes, for example, a tank for accommodating the liquid 50, a pressurizing pump, and a temperature-adjusting unit for adjusting the temperature of the liquid 50 supplied to the space 56. One end of a supply tube 3 is connected to the liquid supply unit 1. Supply nozzles 4 are connected to the other end of the supply tube 3. The liquid supply unit 1 supplies the liquid 50 to the space 56 through the supply tube 3 and the supply nozzles 4.

The liquid recovery unit 2 includes, for example, a suction pump, and a tank for accommodating the recovered liquid 50. One end of a recovery tube 6 is connected to the liquid recovery unit 2. Recovery nozzles 5 are connected to the other end of the recovery tube 6. The liquid recovery unit 2 recovers the liquid 50 from the space 56 through the recovery nozzles 5 and the recovery tube 6. When the space 56 is filled with the liquid 50, then the control unit CONT drives the liquid supply unit 1 so that the liquid 50, which is in a predetermined amount per unit time, is supplied to the space 56 through the supply tube 3 and the supply nozzles 4, and the control unit CONT drives the liquid recovery unit 2 so that the liquid 50, which is in a predetermined amount per unit time, is recovered from the space 56 through the recovery nozzles 5 and the recovery tube 6. Accordingly, the liquid 50 is retained in the space 56 between the substrate P and the tip surface 7 of the projection optical system PL, and thus the liquid immersion portion is formed. In this arrangement, the control unit CONT is capable of arbitrarily setting the liquid supply amount per unit time with respect to the space 56 by controlling the liquid supply unit 1. Further, the control unit CONT is capable of arbitrarily setting the liquid recovery amount per unit time from the substrate P by controlling the liquid recovery unit 2.

Figure 2:
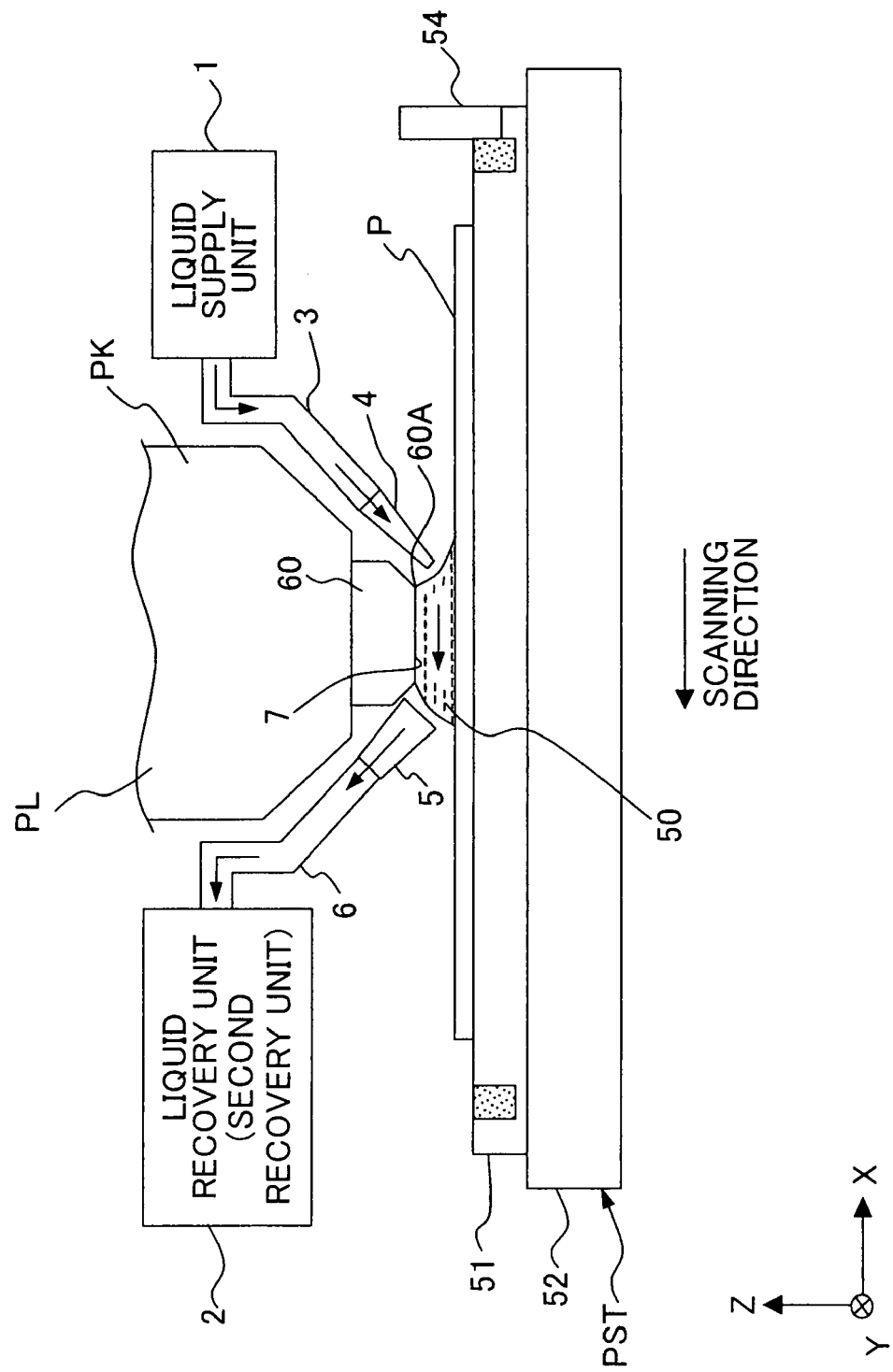
FIG. 2 shows a positional relationship among a tip of a projection optical system, a liquid supply unit, and a liquid recovery unit.

FIG. 2 shows a partial magnified view of FIG. 1 illustrating, for example, the lower portion of the projection optical system PL of the exposure apparatus EX, the liquid supply unit 1, and the liquid recovery unit 2. In FIG. 2, the lens 60, which is disposed at the lowest end of the projection optical system PL, is formed to have a rectangular shape which is long in the Y axis direction (non-scanning direction) except for only the portion required for the end portion 60A in the scanning direction. During the scanning exposure, a pattern image of a part of the mask M is projected onto the rectangular projection area disposed just under the end portion 60A. The mask M is moved at the velocity V in the −X direction (or in the +X direction) with respect to the projection optical system PL, in synchronization with which the substrate P is moved at the velocity β•V (β is the projection magnification) in the +X direction (or in the −X direction) by the aid of the XY stage 52. After the completion of the exposure for one shot area, the next shot area is moved to the scanning start position in accordance with the stepping of the substrate P. The exposure process is successively performed thereafter for each of the shot areas in accordance with the step-and-scan system. This embodiment is designed so that the liquid 50 is allowed to flow in the movement direction of the substrate P along with the movement direction of the substrate P.

Figure 3:
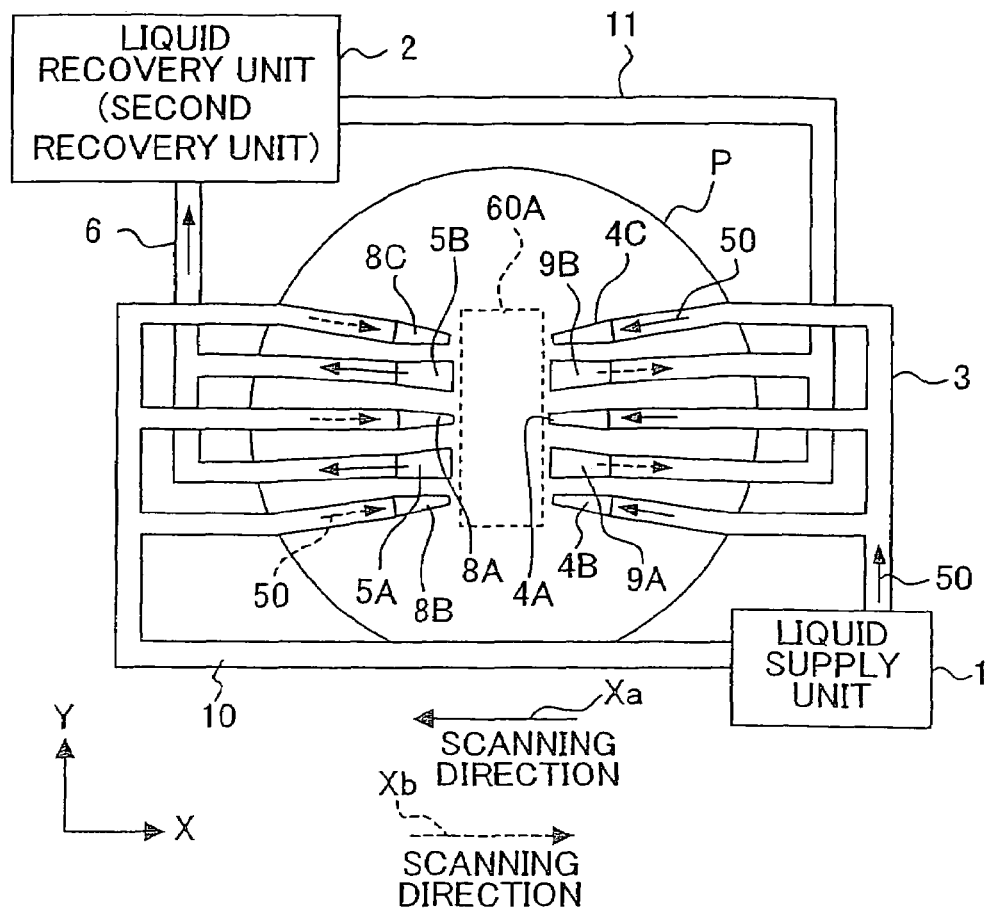
FIG. 3 shows an exemplary arrangement of supply nozzles and recovery nozzles.

FIG. 3 shows the positional relationship among the end portion 60A of the lens 60 of the projection optical system PL, the supply nozzles 4 (4A to 4C) for supplying the liquid 50 in the X axis direction, and the recovery nozzles 5 (5A, 5B) for recovering the liquid 50. In FIG. 3, the end portion 60A of the lens 60 has a rectangular shape which is long in the Y axis direction. The three supply nozzles 4A to 4C are arranged on the side in the +X direction, and the two recovery nozzles 5A, 5B are arranged on the side in the −X direction so that the end portion 60A of the lens 60 of the projection optical system PL is interposed thereby. The supply nozzles 4A to 4C are connected to the liquid supply unit 1 through the supply tube 3, and the recovery nozzles 5A, 5B are connected to the liquid recovery unit 2 through the recovery tube 6. Further, the supply nozzles 8A to 8C and the recovery nozzles 9A, 9B are arranged at positions obtained by rotating, by substantially 180°, the positions of the supply nozzles 4A to 4C and the recovery nozzles 5A, 5B about the center of the end portion 60A. The supply nozzles 4A to 4C and the recovery nozzles 9A, 9B are alternately arranged in the Y axis direction. The supply nozzles 8A to 8C and the recovery nozzles 5A, 5B are alternately arranged in the Y axis direction. The supply nozzles 8A to 8C are connected to the liquid supply unit 1 through the supply tube 10. The recovery nozzles 9A, 9B are connected to the liquid recovery unit 2 through the recovery tube 11.

Figure 4:
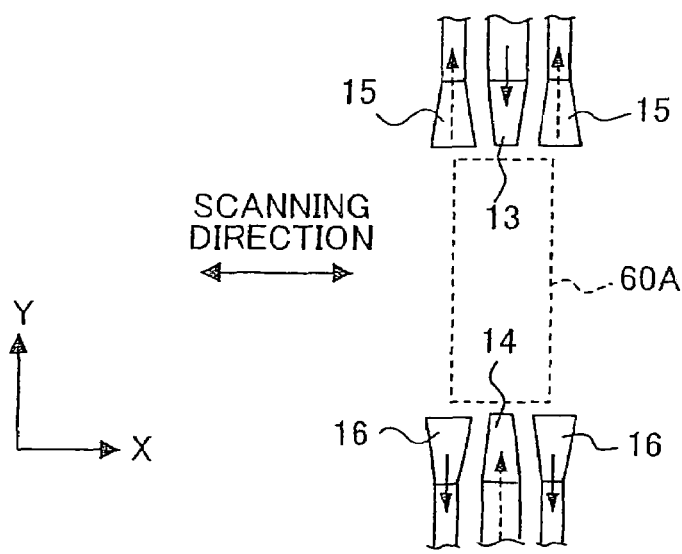
FIG. 4 shows an exemplary arrangement of supply nozzles and recovery nozzles.

As shown in FIG. 4, the supply nozzles 13, 14 and the recovery nozzles 15, 16 may be also provided on the both sides of the end portion 60A in the Y direction so that the end portion 60A is intervened between the supply nozzles 13, 14 and the recovery nozzles 15, 16. The supply nozzles and the recovery nozzles can be used to stably supply the liquid 50 to the space between the projection optical system PL and the substrate P even during the movement of the substrate P in the non-scanning direction (Y axis direction) when the stepping movement is performed.

The shape of the nozzle is not specifically limited. For example, two pairs of the nozzles may be used to supply or recover the liquid 50 for the long side of the end portion 60A. In this arrangement, the supply nozzles and the recovery nozzles may arranged while being aligned vertically in order that the liquid 50 can be supplied and recovered in any one of the directions of the +X direction and the −X direction.

Figure 5:
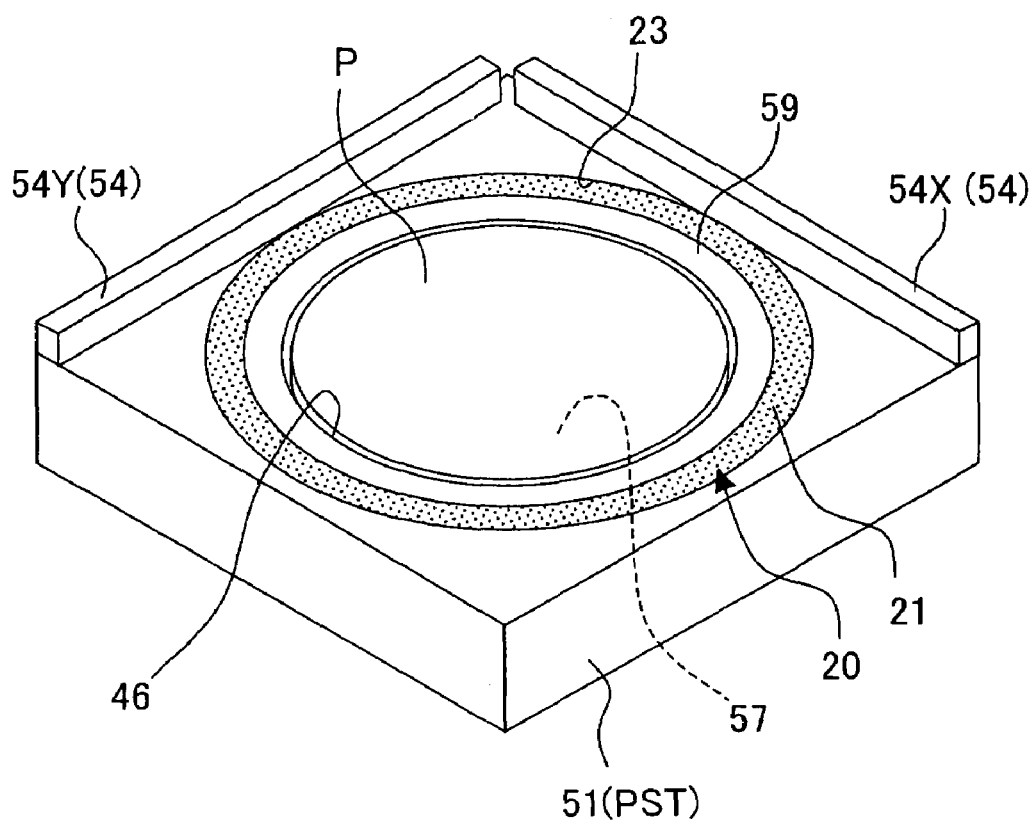
FIG. 5 shows a perspective view illustrating an embodiment of a recovery unit.

Next, an explanation will be made with reference to FIGS. 5 and 6 about an embodiment of the recovery unit 20 for recovering the liquid outflowed to the outside of the substrate P. FIG. 5 shows a perspective view illustrating the Z stage 51 (substrate stage PST), and FIG. 6 shows a magnified sectional view illustrating major parts.

Figure 6:
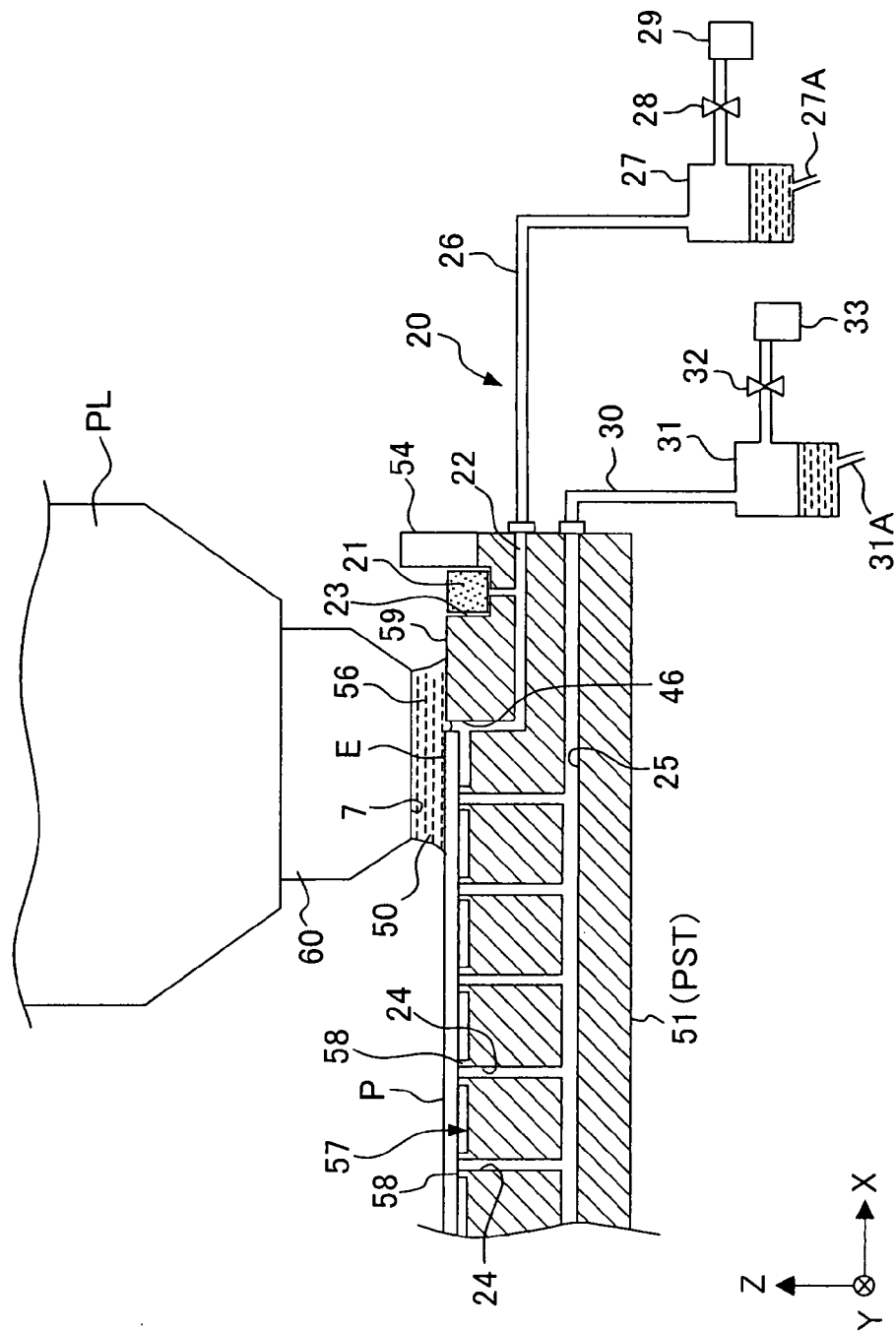
FIG. 6 shows a magnified sectional view illustrating major parts depicting the embodiment of the recovery unit.

In FIGS. 5 and 6, the recovery unit 20 is provided with a liquid-absorbing member 21 which is arranged around the substrate P held by a holder 57 on the Z stage 51. The liquid-absorbing member 21 is an annular member having a predetermined width. The liquid-absorbing member 21 is arranged in a groove 23 which is formed annularly on the Z stage 51. A flow passage 22, which is continued to the groove 23, is formed in the Z stage 51. The bottom of the liquid-absorbing member 21 arranged in the groove 23 is connected to the flow passage 22. The liquid-absorbing member 21 is composed of, for example, a porous material such as porous ceramics. Alternatively, sponge as a porous material may be used as a material for forming the liquid-absorbing member 21. The liquid-absorbing member 21 composed of the porous material is capable of retaining the liquid in a predetermined amount.

An auxiliary plate 59 having a predetermined width, which surrounds the outer circumference of the substrate P, is provided between the liquid-absorbing member 21 and the substrate P held by the holder 57 on the Z stage 51. The surface height of the auxiliary plate 59 is set to be approximately coincident with the surface height of the substrate P held by the holder 57 of the Z stage 51. The liquid 50 can be continuously retained between the substrate P and the lens 60 of the projection optical system PL by the aid of the auxiliary plate 59, even when the circumferential area (edge area) E of the substrate P is positioned under the lens 60 of the projection optical system PL. The liquid-absorbing member 21 having the predetermined width, which is arranged to surround the outer circumference of the auxiliary plate 59, functions to absorb (recover) the liquid 50 which cannot be fully recovered by the liquid recovery unit 2 as the second recovery unit and which outflows to the outside of the auxiliary plate 59.

The holder 57 has a plurality of projections 58 provided to support the back surface of the substrate P in a circular recess which is formed to approximately the same size as that of the substrate P on the Z stage 51. Attraction holes 24, which serve to attract and hold the substrate P, are provided for the projections 58 respectively. The respective attraction holes 24 are connected to a flow passage 25 which is formed in the Z stage 51. A plurality of liquid recovery holes 46 are provided in the vicinity of the outermost circumference of the holder 57 (circular recess). The liquid recovery holes 46 are connected to the flow passage 22 which is connected to the liquid-absorbing member 21. Alternatively, another flow passage, which is different from the flow passage 22 connected to the liquid-absorbing member 21 (groove 23), may be provided to make connection to the liquid recovery holes 46.

The flow passage 22, which is connected to the liquid-absorbing member 21 and the liquid recovery holes 46 respectively, is connected to one end of a tube passage 26 which is provided outside the Z stage 51. On the other hand, the other end of the tube passage 26 is connected to a pump 29 as a suction unit via a first tank 27 and a valve 28 provided outside the Z stage 51. The flow passage 25, which is connected to the attraction holes 24, is connected to one end of a tube passage 30 which is provided outside the Z stage 51. On the other hand, the other end of the tube passage 30 is connected to a pump 33 as a suction unit via a second tank 31 and a valve 32 provided outside the Z stage 51. The liquid, which outflows to the outside of the substrate P, is recovered together with the surrounding gas (air) from the liquid-absorbing member 21 and the liquid recovery holes 46. The liquid, which leaks into the back surface side of the substrate P, is recovered together with the surrounding gas (air) from the attraction holes 24. The method for recovering the liquid as described above will be explained in detail later on. The liquid (water), which is recovered from the liquid-absorbing member 21, the liquid recovery holes 46, and the attraction holes 24, is separated from the gas (air), and the liquid is temporarily accumulated in the first tank 27 and the second tank 31 respectively. The gas/liquid separation avoids the inflow of the liquid into the vacuum pumps 29, 33 as the vacuum sources. Thus, it is possible to prevent the vacuum pumps 29, 33 from being damaged. Discharge passage 27A, 31A are provided for the first and second tanks 27, 31 respectively. When predetermined amounts of the liquid are stored as detected by a water level sensor or the like, the liquid is discharged from the discharge passages 27A, 31A.

Alternatively, a flow passage, which is different from the flow passage 22 (tank 27, valve 28, vacuum pump 29) connected to the liquid-absorbing member 21 (groove 23), may be provided to make connection to the liquid recovery holes 46. In FIG. 5, a movement mirror 54X, which extends in the Y axis direction, is provided at the end of the Z stage 51 on the +X side. A movement mirror 54Y, which extends in the X axis direction, is provided at the end on the Y side. Laser interferometers radiate laser beams onto the movement mirrors 54X, 54Y to detect the position of the substrate stage PST in the X axis direction and the Y axis direction.

Next, an explanation will be made about a procedure for exposing the substrate P with the pattern of the mask M by using the exposure apparatus EX described above.

When the mask M is loaded on the mask stage MST, and the substrate P is loaded on the substrate stage PST, then the control unit CONT drives the liquid supply unit 1 and the liquid recovery unit 2 to form the liquid immersion portion of the liquid 50 in the space 56 (see FIG. 1). The control unit CONT controls the illumination optical system IL to illuminate the mask M with the exposure light beam EL, and the image of the pattern of the mask M is projected onto the substrate P through the projection optical system PL and the liquid 50. In this situation, the liquid 50, which is supplied from the liquid supply unit 1, is recovered by the liquid recovery unit 2 during the period in which the shot area disposed in the vicinity of the center of the substrate P is exposed. Therefore, the liquid 50 does not outflow to the outside of the substrate P.

On the other hand, as shown in FIG. 6, when the edge area E of the substrate P is subjected to the exposure process, and the liquid immersion portion between the projection optical system PL and the substrate P is thereby disposed in the vicinity of the edge area E of the substrate P, then the liquid 50 can be continuously retained between the projection optical system PL and the substrate P by the aid of the auxiliary plate 59. However, a part of the liquid 50 sometimes outflows to the outside of the auxiliary plate 59. The outflowed fluid 50 is absorbed (recovered) by the liquid-absorbing member 21. The control unit CONT starts the opening operation of the valve 28 and the driving operation of the pump 29 simultaneously with the start of the driving operation of the liquid supply unit 1 and the liquid recovery unit 2. Therefore, the liquid 50, which is recovered by the liquid-absorbing member 21, is sucked and collected into the first tank 27 through the flow passage 22 and the tube passage 26 together with the surrounding air in accordance with the suction effected by the pump 29 as the suction unit.

The liquid 50, which outflows from the gap between the substrate P and the auxiliary plate 59, is sucked to the side of the flow passage 22 together with the surrounding air through the liquid recovery holes 46 provided on the back surface side of the substrate P. The liquid 50 is recovered into the first tank 27 through the tube passage 26.

Further, there may be the following possibility. That is, the liquid 50, which enters the back surface side of the substrate P via the gap between the substrate P and the auxiliary plate 59, may inflow into the attraction holes 24 for attracting and holding the substrate P. As described above, the attraction holes 24 are connected to the pump 33 as the suction unit via the flow passage 25, the tube passage 30, and the second tank 31. Therefore, when the opening operation of the valve 32 and the driving operation of the pump 33 are performed, then the substrate P is attracted and held on the Z stage 51, and the liquid 50, which inflows into the attraction holes 24, can be collected into the second tank 31 through the flow passage 25 and the tube passage 30. That is, the third recovery unit, which recovers the liquid 50 inflowed into the attraction holes 24, includes the fluid passage 25, the tube passage 30, the second tank 31, the valve 32, the pump 33, and the control unit CONT for controlling the driving of these components. In this situation, the attraction holes 24 also function as liquid recovery holes (recovery unit) provided on the back surface side of the substrate P.

The liquid which has leaked into the back surface side of the substrate P and the gas (air) which is around the back surface of the substrate P inflow from the attraction holes 24 in the same manner as from the liquid recovery holes 46. However, the liquid (water) and the gas (air) are separated from each other by making the liquid to fall in the second tank 31. The liquid, which is stored in the second tank 31, is periodically recovered, and thus the vacuum pump 33 as the vacuum source is prevented from the inflow of the liquid. Accordingly, the vacuum pump 33 is prevented from being damaged.

When the edge area E of the substrate P is subjected to the exposure process, i.e., when the liquid immersion portion between the projection optical system PL and the substrate P is disposed in the vicinity of the circumferential edge of the substrate P, there is such a possibility that a part of the liquid 50 may outflow to the outside of the substrate P as described above. In this embodiment, the control unit CONT performs the following operation in order that the space between the projection optical system PL and the substrate P can be sufficiently filled with the liquid 50 even when the liquid 50 outflows to the outside of the substrate P. That is, when the liquid immersion portion is disposed in the edge area E of the substrate P, the control unit CONT performs at least any one of the operation in which the liquid supply unit 1 is controlled to increase the liquid supply amount per unit time to the space 56 and the operation in which the liquid recovery unit (second recovery unit) 2 is controlled to decrease the liquid recovery amount per unit time from the space 56. In the control to increase the liquid supply amount or decrease the liquid recovery amount, the control unit CONT may control the liquid supply unit 1 and/or the liquid recovery unit 2 on the basis of the result of the detection of the position of the substrate P performed by the laser interferometer. Alternatively, a detecting unit for detecting the amount of the recovered (outflowed) liquid may be provided, for example, for the first and second tanks 27, 32 or the tube passages 26, 30, and the liquid supply unit 1 and/or the liquid recovery unit 2 may be controlled on the basis of the result of the detection performed by the detecting unit.

The exposure apparatus EX of this embodiment is a so-called scanning stepper. Therefore, when the scanning exposure is performed by moving the substrate P in the scanning direction (−X direction) indicated by the arrow Xa (see FIG. 3), the liquid 50 is supplied and recovered with the liquid supply unit 1 and the liquid recovery unit 2 by using the supply tube 3, the supply nozzles 4A to 4C, the recovery tube 6, and the recovery nozzles 5A, 5B. That is, when the substrate P is moved in the −X direction, then the liquid 50 is supplied to the space between the projection optical system PL and the substrate P from the liquid supply unit 1 by the aid of the supply tube 3 and the supply nozzles 4 (4A to 4C), and the liquid 50 is recovered to the liquid recovery unit 2 by the aid of the recovery nozzles 5 (5A, 5B) and the recovery tube 6. The liquid 50 flows in the −X direction so that the space between the lens 60 and the substrate P is filled therewith. On the other hand, when the scanning exposure is performed by moving the substrate P in the scanning direction (+X direction) indicated by the arrow Xb, then the liquid 50 is supplied and recovered with the liquid supply unit 1 and the liquid recovery unit 2 by using the supply tube 10, the supply nozzles 8A to 8C, the recovery tube 11, and the recovery nozzles 9A, 9B. That is, when the substrate P is moved in the +X direction, then the liquid 50 is supplied from the liquid supply unit 1 to the space between the projection optical system PL and the substrate P by the aid of the supply tube 10 and the supply nozzles 8 (8A to 8C), and the liquid 50 is recovered to the liquid recovery unit 2 by the aid of the recovery nozzles 9 (9A, 9B) and the recovery tube 11. The liquid 50 flows in the +X direction so that the space between the lens 60 and the substrate P is filled therewith. As described above, the control unit CONT makes the liquid 50 to flow in the movement direction of the substrate P by using the liquid supply unit 1 and the liquid recovery unit 2. In this arrangement, for example, the liquid 50, which is supplied from the liquid supply unit 1 through the supply nozzles 4, flows so that the liquid 50 is attracted and introduced into the space 56 in accordance with the movement of the substrate P in the −X direction. Therefore, even when the supply energy of the liquid supply unit 1 is small, the liquid 50 can be supplied to the space 56 with ease. When the direction, in which the liquid 50 is made to flow, is switched depending on the scanning direction, then it is possible to fill the space between the substrate P and the tip surface 7 of the lens 60 with the liquid 50, and it is possible to obtain the high resolution and the wide depth of focus, even when the substrate P is subjected to the scanning in any one of the +X direction and the −X direction.

As explained above, even when the liquid 50 outflows to the outside of the substrate P, the outflowed liquid 50 is recovered by the recovery unit 20 without being left to stand. Therefore, the variation of the environment in which the substrate P is placed is suppressed, and the occurrence of the inconvenience is also suppressed, which would be otherwise caused such that any rust or the like appears on mechanical parts disposed around the substrate stage PST for supporting the substrate P. Therefore, the pattern can be accurately transferred to the substrate P, and it is possible to produce a device having a high pattern accuracy.

The liquid-absorbing member 21 is provided as the recovery unit 20 on the substrate stage PST, and thus the liquid 50 can be reliably retained (recovered) over a wide range. Further, the pump 29, which serves as the suction unit, is connected to the liquid-absorbing member 21 via the flow passage, and thus the liquid 50, which is absorbed by the liquid-absorbing member 21, is always discharged to the outside of the substrate stage PST. Therefore, it is possible to more reliably suppress the variation of the environment in which the substrate P is placed, and it is possible to suppress the variation of the weight of the substrate stage PST, which would be otherwise caused by the liquid 50. Alternatively, the following procedure is also available. That is, the pump 29 is stopped during the exposure for the substrate, and the liquid 50, which is outflowed to the outside of the substrate P, is retained, for example, by the liquid-absorbing member 21. The pump 29 is operated after the completion of the exposure for the substrate so that the liquid is discharged. On the other hand, the following arrangement is also available. That is, the liquid 50, which is recovered by the liquid-absorbing member 21, is discharged in an untreated manner toward the tank 27 in accordance with the self-weight without providing the pump 29. Further, the following arrangement is also available. That is, the pump 29, the tank 27, and the flow passage are not provided, and only the liquid-absorbing member 21 is arranged on the substrate stage PST. The liquid-absorbing member 21, which has absorbed the liquid 50, is exchanged periodically (for example, for every one lot). In this arrangement, the weight of the substrate stage PST is varied by the liquid 50. However, the stage positioning accuracy can be maintained by changing the stage control parameter depending on the weight of the liquid 50 recovered by the liquid-absorbing member 21.

The tanks 27, 31, which are used to separate the liquid (water) and the gas (air) from each other, are provided at the upstream of the vacuum pumps 29, 33 to avoid any inflow of the liquid into the vacuum pumps 29, 33. Therefore, the vacuum pumps 29, 33 can be prevented from being broken down and damaged.

The vacuum pumps 29, 33 in the embodiment described above may be arranged in the exposure apparatus EX. Alternatively, it is also allowable to use those installed in a factory in which the exposure apparatus EX is installed. In the embodiment described above, the tank, which is used to separate the liquid (water) and the gas (air) from each other, is provided for the vacuum system of the recovery unit 20 (at the upstream of the vacuum pump) for recovering the liquid outflowed to the outside of the substrate P and for the vacuum system for attracting and holding the substrate P. However, there is no limitation thereto in relation to the installation of the mechanism (for example, the tank for recovering the liquid) for separating the liquid (water) and the gas (air) from each other. Such a mechanism may be provided in the suction system (vacuum system) connected to any other suction port for which it is feared that the liquid may make any inflow. For example, such a mechanism may be arranged in a gas recovery system (suction system) for a gas bearing, a suction system for attracting and holding the substrate P on a substrate transport arm, or a suction system for detachably attracting and holding a substrate-holding member on the substrate stage. The gas recovery system (suction system) for the gas bearing is disclosed, for example, in Japanese Patent Application Laid-open No. 11-166990, the suction system for attracting and holding the substrate P on the substrate transport arm is disclosed, for example, in Japanese Patent Application Laid-open No. 6-181157, and the suction system for detachably attracting and holding the substrate-holding member on the substrate stage is disclosed, for example, in Japanese Patent Application Laid-open No. 10-116760. The contents of the descriptions in these documents are incorporated herein by reference within a range of permission of the domestic laws and ordinances of the state designated or selected in this international application. In this embodiment, the mechanism, which includes, for example, the tank for separating the liquid (water) and the gas (air) from each other, is applied to the exposure apparatus in which the substrate P is subjected to the exposure while forming the liquid immersion portion in a part of the area on the substrate P. However, the present invention is also applicable to an exposure apparatus in which a substrate stage is moved in a liquid tank, and an exposure apparatus in which a liquid tank is formed on a substrate stage and a substrate is held therein. The structure and the exposure operation of the exposure apparatus in which the substrate stage is moved in the liquid tank are disclosed, for example, in Japanese Patent Application Laid-open No. 6-124873, and the exposure apparatus in which the liquid tank is formed on the substrate stage and the substrate is held therein is disclosed, for example, in Japanese Patent Application Laid-open No. 10-303114 and U.S. Pat. No. 5,825,043. The contents of the descriptions in these documents are incorporated herein by reference within a range of permission of the domestic laws and ordinances of the state designated or selected in this international application.

In the embodiment described above, the liquid-absorbing member 21 is formed to have the annular form which continues to surround the entire circumference of the substrate P. However, the liquid-absorbing member 21 may be arranged at a part of the circumference of the substrate P. Alternatively, the liquid-absorbing member 21 may be arranged discontinuously at predetermined intervals. In this embodiment, the liquid-absorbing member 21 is formed to have the annular form. However, the shape of the liquid-absorbing member 21 may be, for example, rectangular, which may be arbitrarily designed.

The arrangement of the liquid supply unit 1 and the liquid recovery unit 2 and the arrangement of the nozzles are not limited to those described in the foregoing embodiment. It is not necessarily indispensable that the liquid supply unit 1 and the liquid recovery unit 2 are operated concurrently during the exposure for the substrate P. Any one of them may be stopped or both of them may be stopped provided that the optical path for the exposure light beam, which is disposed between the projection optical system PL and the substrate P, is filled with the liquid 50.

As described above, pure water is used as the liquid 50 in this embodiment. Pure water is advantageous in that pure water is available in a large amount with ease, for example, in the semiconductor production factory, and pure water exerts no harmful influence, for example, on the optical element (lens) and the photoresist on the substrate P. Further, pure water exerts no harmful influence on the environment, and the content of impurity is extremely low. Therefore, it is also expected to obtain the function to wash the surface of the substrate P and the surface of the optical element provided at the tip surface of the projection optical system PL.

It is approved that the refractive index n of pure water (water) with respect to the exposure light beam EL having a wavelength of about 193 nm is approximately in an extent of 1.44 to 1.47. When the ArF excimer laser beam (wavelength: 193 nm) is used as the light source of the exposure light beam EL, then the wavelength is shortened on the substrate P by $1/n$, i.e., to about 131 to 134 nm, and a high resolution is obtained. Further, the depth of focus is magnified about n times, i.e., about 1.44 to 1.47 times as compared with the value obtained in the air. Therefore, when it is enough to secure an approximately equivalent depth of focus as compared with the case of the use in the air, it is possible to further increase the numerical aperture of the projection optical system PL. Also in this viewpoint, the resolution is improved.

In this embodiment, the lens 60 is attached to the tip of the projection optical system PL. However, the optical element, which is attached to the tip of the projection optical system PL, may be an optical plate which is usable to adjust the optical characteristics of the projection optical system PL, for example, the aberration (for example, spherical aberration and comatic aberration). Alternatively, the optical element may be a parallel plane plate through which the exposure light beam EL is transmissive. When the optical element, which makes contact with the liquid 50, is the parallel plane plate which is cheaper than the lens, it is enough that merely the parallel plane plate is exchanged immediately before supplying the liquid 50 even when any substance (for example, any silicon-based organic matter), which deteriorates the transmittance of the projection optical system PL, the illuminance of the exposure light beam EL on the substrate P, and the uniformity of the illuminance distribution, is adhered to the parallel plane plate, for example, during the transport, the assembling, and/or the adjustment of the exposure apparatus EX. An advantage is obtained such that the exchange cost is lowered as compared with the case in which the optical element to make contact with the liquid 50 is the lens. That is, the surface of the optical element to make contact with the liquid 50 is dirtied, for example, due to the adhesion of scattered particles generated from the resist by being irradiated with the exposure light beam EL or any impurity contained in the liquid 50. Therefore, it is necessary to periodically exchange the optical element. However, when the optical element is the cheap parallel plane plate, then the cost of the exchange part is low as compared with the lens, and it is possible to shorten the time required for the exchange. Thus, it is possible to suppress the increase in the maintenance cost (running cost) and the decrease in the throughput.

When the pressure, which is generated by the flow of the liquid 50, is large between the substrate P and the optical element disposed at the tip of the projection optical system PL, it is also allowable that the optical element is tightly fixed so that the optical element is not moved by the pressure, rather than allowing the optical element to be exchangeable.

The liquid 50 is water in the embodiment described above. However, the liquid 50 may be any liquid other than water. For example, when the light source of the exposure light beam EL is the $F_2$ laser, the $F_2$ laser beam is not transmitted through water. Therefore, in this case, those preferably usable as the liquid 50 may include, for example, fluorine-based liquids such as fluorine-based oil and fluoropolyether (PFPE) through which the $F_2$ laser beam is transmissive. Alternatively, other than the above, it is also possible to use, as the liquid 50, those (for example, cedar oil) which have the transmittance with respect to the exposure light beam EL, which have the refractive index as high as possible, and which are stable against the photoresist applied to the surface of the substrate P and the projection optical system PL.

Second Embodiment

Next, an explanation will be made with reference to FIG. 7 about another embodiment of the exposure apparatus EX of the present invention. In the following description, the same or equivalent constitutive parts as those of the embodiment described above are designated by the same reference numerals, any explanation of which is simplified or omitted. The characteristic features of this embodiment are that a liquid recovery groove 35 is provided around the substrate P in place of the liquid-absorbing member 21 as the recovery unit and that the substrate stage PST and the tube passage 26 are connectable to one another and separable from each other.

Figure 7:
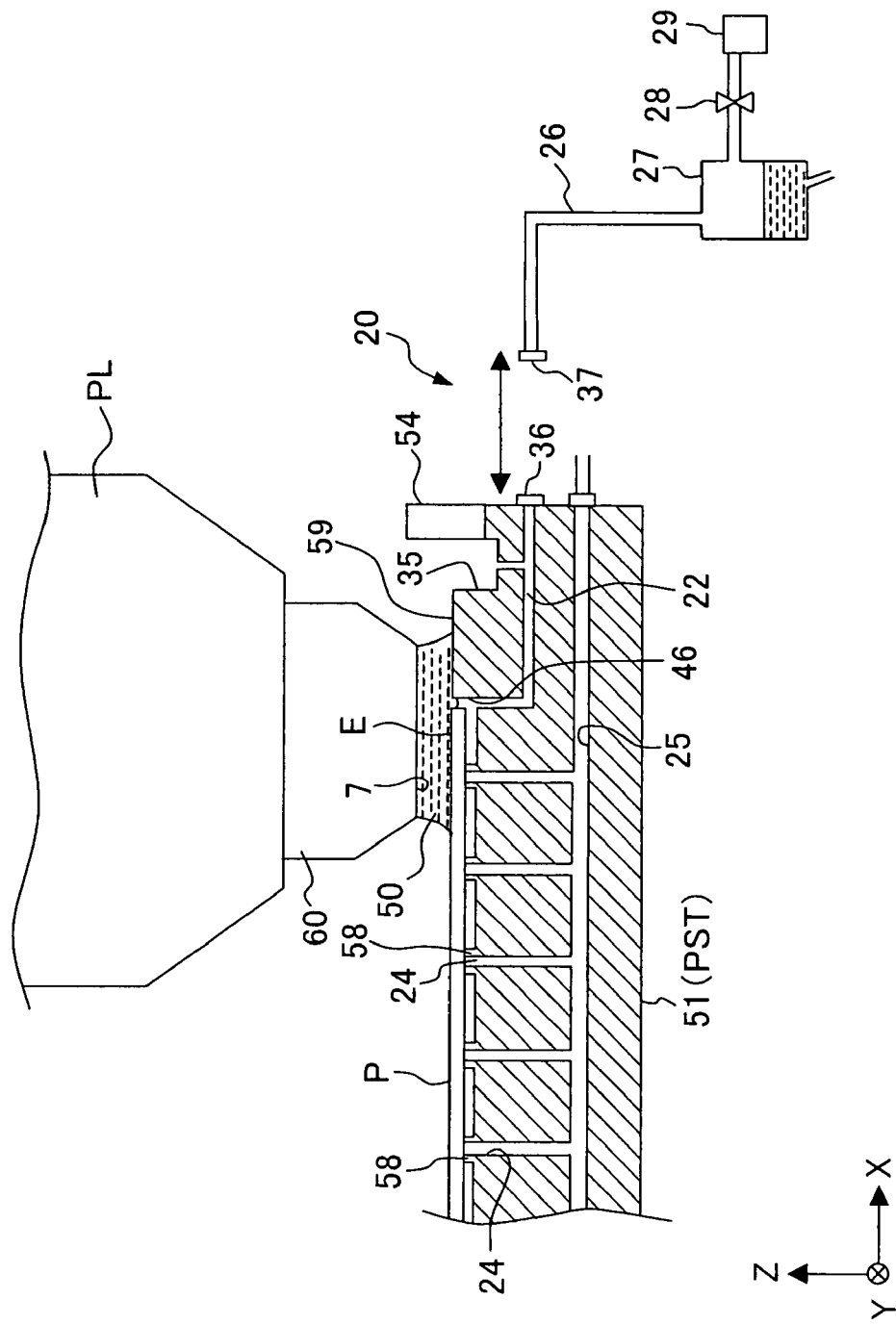
FIG. 7 shows a magnified sectional view illustrating major parts depicting another embodiment of a recovery unit.

With reference to FIG. 7, the recovery unit 20 includes the liquid recovery groove 35 which has a predetermined width and which is formed around the auxiliary plate 59 on the Z stage 51. A connecting valve 36 is provided at the end of the flow passage 22. On the other hand, a connecting valve 37, which is connectable and separable with respect to the connecting valve 36, is provided at the end of the tube passage 26. In a state in which the connecting valves 36, 37 are separated from each other, the end of the flow passage 22 is closed so that the fluid 50 does not outflow to the outside of the stage. On the other hand, when the connecting valves 36, 37 are connected to each other, then the end of the flow passage 22 is opened, and the liquid 50 in the flow passage 22 can flow to the tube passage 26.

During the exposure process, the connecting valve 36 is separated from the connecting valve 37. Therefore, the substrate stage PST is in a state of being separated from the tube passage 26 during the exposure process. Therefore, it is possible to smoothly perform the movement in the scanning direction (scanning movement) and the movement in the non-scanning direction (stepping movement). The liquid 50, which outflows to the outside of the substrate P during the exposure process, is pooled or stored in the liquid recovery groove 35 and the flow passage 22.

When the exposure process is completed, the substrate stage PST is moved to the exchange position for the substrate P (load/unload position). The connecting valves 36, 37 are connected to each other at the substrate exchange position. When the connecting valves 36, 37 are connected to each other, then the control unit CONT opens the valve 28, and the control unit CONT drives the pump 29. Accordingly, the liquid 50, which has been recovered by the liquid recovery groove 35 as the recovery unit, is discharged to the outside of the stage at the substrate exchange position.

This embodiment is constructed such that the liquid 50 recovered by the liquid recovery groove 35 is discharged to the outside of the stage periodically (for example, for every one lot). Therefore, the liquid recovery groove 35 is designed to have, for example, a size (volume) of such an extent that the liquid, which corresponds to the amount of outflow of one lot, can be retained. In this arrangement, the relationship between a predetermined number of the substrates to be subjected to the exposure process (i.e., corresponding to one lot) and the amount of the liquid to be outflowed is previously determined. The size of the liquid recovery groove 35 is set on the basis of the determined relationship. Further, the time interval for connecting the connecting valves 36, 37 (i.e., the timing to perform the operation for discharging the liquid to the outside of the stage) is set on the basis of the determined relationship described above.

In the embodiment described above, the liquid recovery groove 35 is formed to have the annular form which continues to surround the entire circumference of the substrate P. However, the liquid recovery groove 35 may be arranged at a part of the circumference of the substrate P. Alternatively, the liquid recovery groove 35 may be arranged discontinuously at predetermined intervals. In this embodiment, the liquid recovery groove 35 is formed to have the annular form. However, the shape of the liquid recovery groove 35 may be, for example, rectangular, which may be arbitrarily designed. Further, the liquid-absorbing member may be arranged in the liquid recovery groove 35.

In the respective embodiments described above, the auxiliary plate 59 is provided at the outside of the substrate P. However, the liquid-absorbing member 21 and/or the liquid recovery groove 35 may be provided at the position in the vicinity of the outer circumference of the substrate P without providing the auxiliary plate 59.

The embodiment described above adopts the exposure apparatus in which the space between the projection optical system PL and the substrate P is locally filled with the liquid. However, the recovery mechanism of the present invention, which recovers the liquid inflowed into the attraction holes for attracting and holding the substrate P as disclosed in FIGS. 6 and 7, is also applicable to the liquid immersion exposure apparatus in which the stage for holding the exposure objective substrate is moved in the liquid tank and the liquid immersion exposure apparatus in which the liquid tank having the predetermined depth is formed on the stage and the substrate is held therein. As described above, the structure and the exposure operation of the liquid immersion exposure apparatus in which the stage holding the exposure objective substrate is moved in the liquid tank are disclosed, for example, in Japanese Patent Application Laid-open No. 6-124873, and the structure and the exposure operation of the liquid immersion exposure apparatus in which the liquid tank having the predetermined depth is formed on the substrate stage and the substrate is held therein are disclosed, for example, in Japanese Patent Application Laid-open No. 10-303114 (corresponding to U.S. Pat. No. 5,825,043).

Third Embodiment

An explanation will be made below with reference to FIGS. 8 to 10 about another embodiment of the recovery unit.

Figure 8:
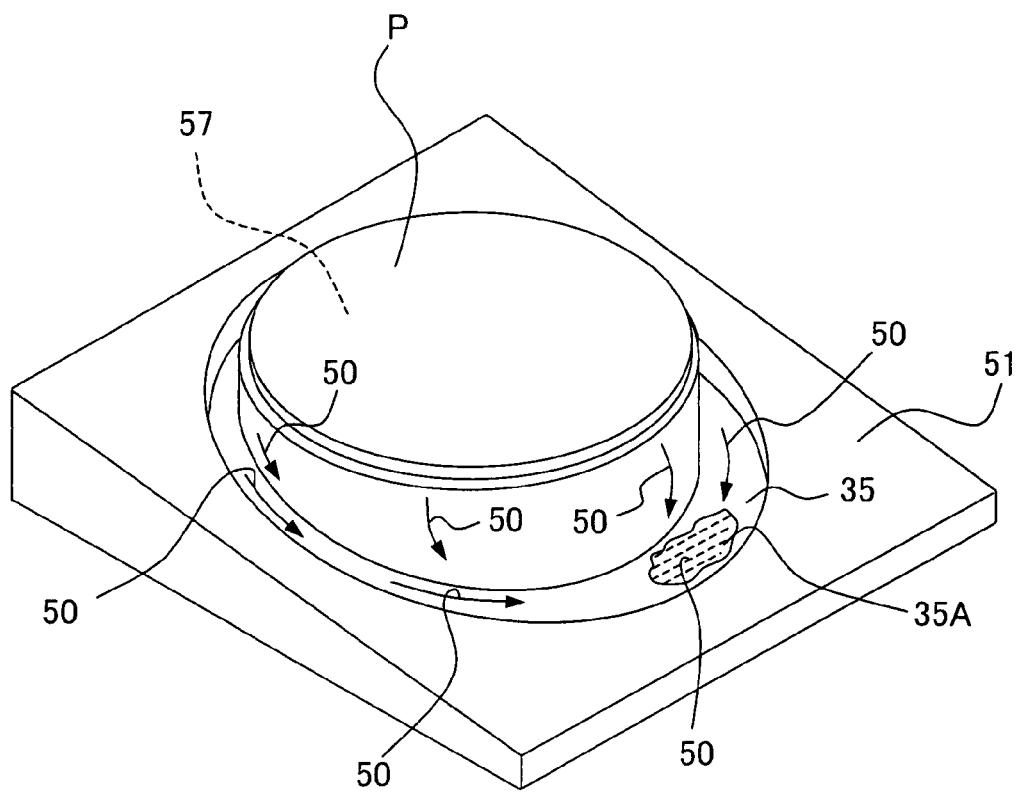
FIG. 8 shows a perspective view illustrating still another embodiment of a recovery unit.

As shown in FIG. 8, the upper surface of the Z stage 51 is inclined, and the upper surface of the holder 57 for holding the substrate P is horizontal. A liquid recovery groove 35 is formed to surround the circumference of the holder 57. In this arrangement, the liquid recovery groove 35 is annular as viewed in a plan view, but the liquid recovery groove 35 is inclined as viewed in a side view. That is, the liquid recovery groove 35 is arranged along the inclination of the upper surface of the Z stage 51. Accordingly, the liquid 50, which outflows to the outside of the substrate P, is spontaneously pooled at an inclined lower section 35A of the liquid recovery groove 35. Accordingly, it is easy to perform the recovery operation for recovering liquid 50 by recovering only the liquid 50 pooled at the inclined lower section 35A.

As shown in FIG. 9A, the liquid recovery groove 35 is provided at a part of the upper surface of the Z stage 51. When the exposure process is performed, the liquid 50 is pooled in the liquid recovery groove 35. As shown in FIG. 9B, the liquid 50, which is pooled in the liquid recovery groove 35, is recovered through a tube 38 which is attached to a transport unit H for loading/unloading the substrate P with respect to the substrate stage PST. A tube 38, which constitutes a part of the suction unit, sucks the liquid 50 pooled in the liquid recovery groove 35 when the transport unit H makes the access with respect to the substrate stage PST in order that the substrate P, for which the exposure process has been completed, is unloaded from the substrate stage PST.

Fourth Embodiment

An explanation will be made below about still another embodiment of the recovery unit. As shown in FIG. 10A, the liquid recovery groove 35 is provided on the upper surface of the Z stage 51. The liquid recovery groove 35 is connected to a flow passage 39 which penetrates to the lower surface side of the Z stage 51. A valve 39A is provided in the flow passage 39. Flow passages 40, 41 as through-holes are formed through the XY stage 52 and the base 53 respectively corresponding to the flow passage 39 of the Z stage 51. The valve 39A is closed during the exposure process, and the liquid 50 is pooled in the liquid recovery groove 35 as shown in FIG. 10A. When the exposure process is completed, then the control unit CONT moves the substrate stage PST to the substrate exchange position, and the valve 39A is opened. Accordingly, as shown in FIG. 10B, the liquid 50 contained in the liquid recovery groove 35 is discharged to the outside of the stage in accordance with the self-weight at the substrate exchange position through the flow passages 39, 40, 41. It is preferable that the liquid 50 contained in the liquid recovery groove 35 is recovered at the substrate exchange position. However, it is also allowable that the discharge operation is performed at any positions other than the substrate exchange position.

Fifth Embodiment

Figure 11:
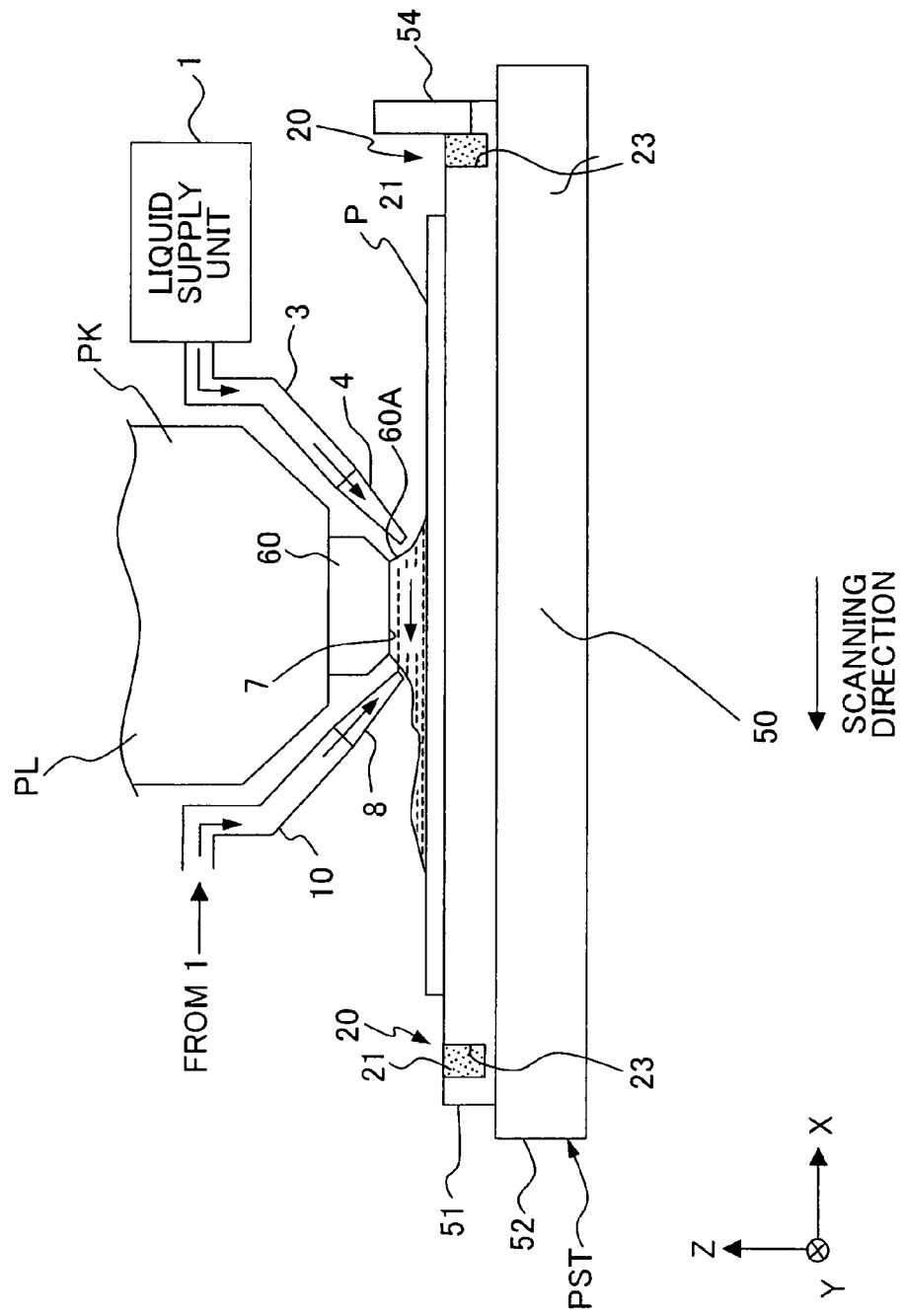
FIG. 11 shows another embodiment of the operation for recovering the liquid by using a recovery unit.
Figure 12:
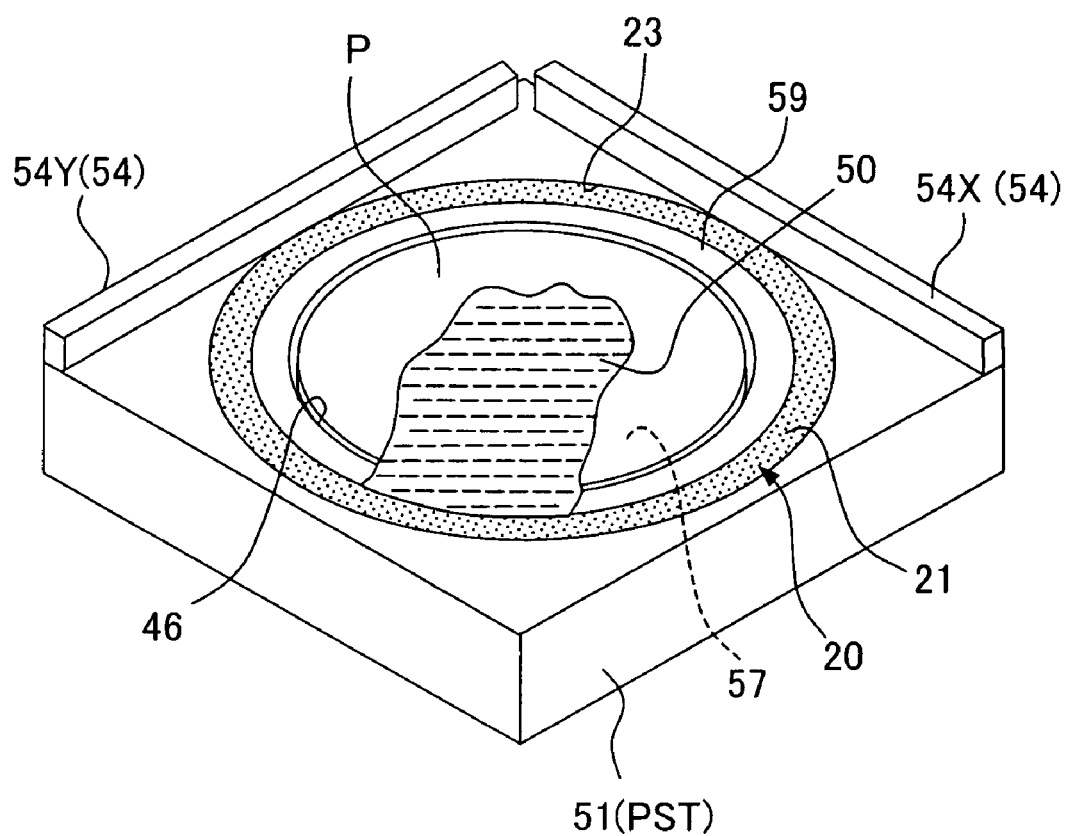
FIG. 12 shows still another embodiment of the operation for recovering the liquid by using a recovery unit.

In the respective embodiments described above, the liquid immersion area is formed on a part of the substrate P such that the liquid supply unit 1 supplies the liquid 50 onto the substrate P above the substrate P (from above the substrate P) by the aid of the supply nozzles 4, and the liquid recovery unit 2 as the second recovery unit recovers the liquid 50 disposed on the substrate P above the substrate P by the aid of the recovery nozzles 5. However, as shown in FIG. 11, almost all of the liquid 50 supplied onto the substrate P may be recovered by using the recovery unit 20 provided in the substrate stage PST, without providing the liquid recovery unit 2 (recovery nozzles 5) above the substrate P. FIG. 11 shows the supply nozzles 4, 8 which are provided on the both sides of the projection area (optical element 60) of the projection optical system PL, so that the projection area 60 is intervened between the supply nozzles 4, 8 in the scanning direction. When the liquid 50 is supplied in order to perform the scanning exposure for the substrate P, then the liquid 50 may be supplied from any one of the supply nozzles of the supply nozzles 4, 8, depending on the direction of movement of the substrate P or the liquid 50 may be supplied simultaneously from the both supply nozzles 4, 8. The liquid 50, which is supplied from the liquid supply unit 1, is widely spread on the substrate P, making it possible to form a large liquid immersion area. As shown in a perspective view of FIG. 12, the liquid 50 supplied onto the substrate P outflows to the outside of the substrate P soon. However, almost all of the liquid 50 is recovered by the recovery unit 20 having the groove 23 (liquid-absorbing member 21) provided as the recovery port around the substrate P. In this arrangement, the liquid immersion area can be formed on the substrate P in a well-suited manner by continuing the supply of the liquid 50 onto the substrate P by the liquid supply unit 1 during the exposure process for the substrate P. Further, it is possible to create the flow of the fluid 50 on the substrate P owing to the supplied liquid 50. Therefore, it is possible to always supply the flesh (clean) liquid 50 onto the substrate P, and it is possible to make the liquid 50 on the substrate P to flow to arrive at the groove 23.

The liquid recovery unit 2 as the second liquid recovery unit is constructed such that the liquid 50 on the substrate P is sucked and recovered by using the vacuum system above the substrate P by the aid of the recovery nozzles 5. The liquid (water) and the gas (air) are recovered together. Therefore, the liquid hits, for example, against the inner wall of the recovery tube 6, and the sound and/or the vibration appears in some cases. In such a situation, as in the embodiment shown in FIGS. 11 and 12, the liquid 50 is recovered by using only the recovery unit 20 provided for the substrate stage PST without performing the suction and recovery above the substrate P. Accordingly, it is possible to avoid the occurrence of the sound and the vibration during the exposure for the substrate P.

In the case of this embodiment in which the liquid is not recovered above the substrate P, the mechanism shown in FIG. 7 in the second embodiment may be used as the recovery unit 20. In the case of FIG. 7, the vacuum pump 29 does not suck the liquid recovered by the liquid recovery groove 35 during the exposure for the substrate P. Therefore, it is also possible to suppress the occurrence of the sound and the vibration associated with the suction of the liquid, which is more effective.

Further, the following procedure is also available as in the embodiment explained above. That is, the liquid recovery unit 2, which recovers the liquid through the recovery nozzles 5 above the substrate P, is arranged. The liquid is recovered by using only the recovery unit 20 without operating the liquid recovery unit 2 during the exposure for the substrate P. The liquid 50 is recovered by using the liquid recovery unit 2 and the recovery unit 20 in combination after the completion of the exposure for the substrate P. Also in this case, it is possible to suppress the influence of the sound and the vibration associated with the suction (recovery) of the liquid during the exposure for the substrate P.

The substrate P, which is usable in the respective embodiments described above, is not limited to the semiconductor wafer for producing the semiconductor device. Those applicable include, for example, the glass substrate for the display device, the ceramic wafer for the thin film magnetic head, and the master plate (synthetic quartz, silicon wafer) for the mask or the reticle to be used for the exposure apparatus.

As for the exposure apparatus EX, the present invention is also applicable to the scanning type exposure apparatus (scanning stepper) based on the step-and-scan system for performing the scanning exposure for the pattern of the mask M by synchronously moving the mask M and the substrate P as well as the projection exposure apparatus (stepper) based on the step-and-repeat system for performing the full field exposure for the pattern of the mask M in a state in which the mask M and the substrate P are made to stand still, while successively step-moving the substrate P. The present invention is also applicable to the exposure apparatus based on the step-and-stitch system in which at least two patterns are partially overlaid and transferred on the substrate P.

As for the type of the exposure apparatus EX, the present invention is not limited to the exposure apparatus for the semiconductor production apparatus for exposing the substrate P with the semiconductor device pattern. The present invention is also widely applicable, for example, to the exposure apparatus for producing the liquid crystal display device or for producing the display as well as the exposure apparatus for producing, for example, the thin film magnetic head, the image pickup device (CCD), the reticle, or the mask.

The present invention is also applicable to a twin-stage type exposure apparatus. The structure and the exposure operation of the twin-stage type exposure apparatus are disclosed, for example, in documents of Japanese Patent Application Laid-open Nos. 10-163099 and 10-214783, Published Japanese translation of PCT International Publication for Patent Application No. 2000-505958, and U.S. Pat. Nos. 6,341,007, 6,400,441, 6,549,269, and 6,590,634. Reference may be made thereto. These United States Patents are incorporated herein by reference within a range of permission of the domestic laws and ordinances of the state designated or selected in this international application.

When the linear motor is used for the substrate stage PST and/or the mask stage MST, it is allowable to use any one of those of the air floating type based on the use of the air bearing and those of the magnetic floating type based on the use of the Lorentz's force or the reactance force. Each of the stages PST, MST may be either of the type in which the movement is effected along the guide or of the guideless type in which no guide is provided. An example of the use of the linear motor for the stage is disclosed in U.S. Pat. Nos. 5,623,853 and 5,528,118. The contents of the descriptions in the documents are incorporated herein by reference respectively within a range of permission of the domestic laws and ordinances of the state designated or selected in this international application.

As for the driving mechanism for each of the stages PST, MST, it is also allowable to use a plane motor in which a magnet unit provided with two-dimensionally arranged magnets and an armature unit provided with two-dimensionally arranged coils are opposed to each other, and each of the stages PST, MST is driven by the electromagnetic force. In this arrangement, any one of the magnet unit and the armature unit is connected to the stage PST, MST, and the other of the magnet unit and the armature unit is provided on the side of the movable surface of the stage PST, MST.

The reaction force, which is generated in accordance with the movement of the substrate stage PST, may be mechanically released to the floor (ground) by using a frame member so that the reaction force is not transmitted to the projection optical system PL. The method for handling the reaction force is disclosed in detail, for example, in U.S. Pat. No. 5,528,118 (Japanese Patent Application Laid-open No. 8-166475). The contents of the descriptions in the documents are incorporated herein by reference within a range of permission of the domestic laws and ordinances of the state designated or selected in this international application.

The reaction force, which is generated in accordance with the movement of the mask stage MST, may be mechanically released to the floor (ground) by using a frame member so that the reaction force is not transmitted to the projection optical system PL. The method for handling the reaction force is disclosed in detail, for example, in U.S. Pat. No. 5,874,820 (Japanese Patent Application Laid-open No. 8-330224). The contents of the descriptions in the documents are incorporated herein by reference within a range of permission of the domestic laws and ordinances of the state designated or selected in this international application.

As described above, the exposure apparatus EX according to the embodiment of the present invention is produced by assembling the various subsystems including the respective constitutive elements as defined in claims so that the predetermined mechanical accuracy, the electric accuracy, and the optical accuracy are maintained. In order to secure the various accuracies, those performed before and after the assembling include the adjustment for achieving the optical accuracy for the various optical systems, the adjustment for achieving the mechanical accuracy for the various mechanical systems, and the adjustment for achieving the electric accuracy for the various electric systems. The steps of assembling the various subsystems into the exposure apparatus include, for example, the mechanical connection, the wiring connection of the electric circuits, and the piping connection of the air pressure circuits in correlation with the various subsystems. It goes without saying that the steps of assembling the respective individual subsystems are performed before performing the steps of assembling the various subsystems into the exposure apparatus. When the steps of assembling the various subsystems into the exposure apparatus are completed, the overall adjustment is performed to secure the various accuracies as the entire exposure apparatus. It is desirable that the exposure apparatus is produced in a clean room in which, for example, the temperature and the cleanness are managed.

Figure 13:
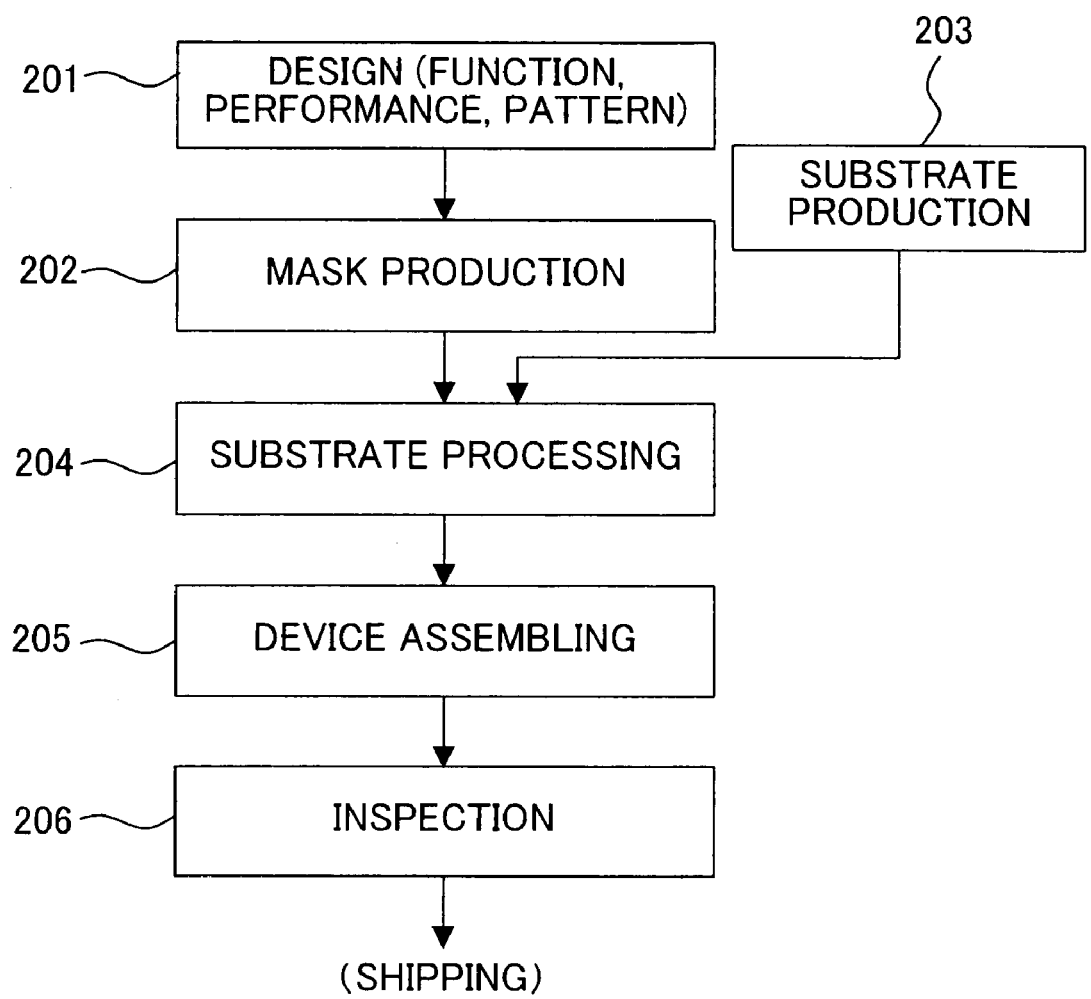
FIG. 13 shows a flow chart illustrating exemplary steps for producing a semiconductor device.
Figure 14:
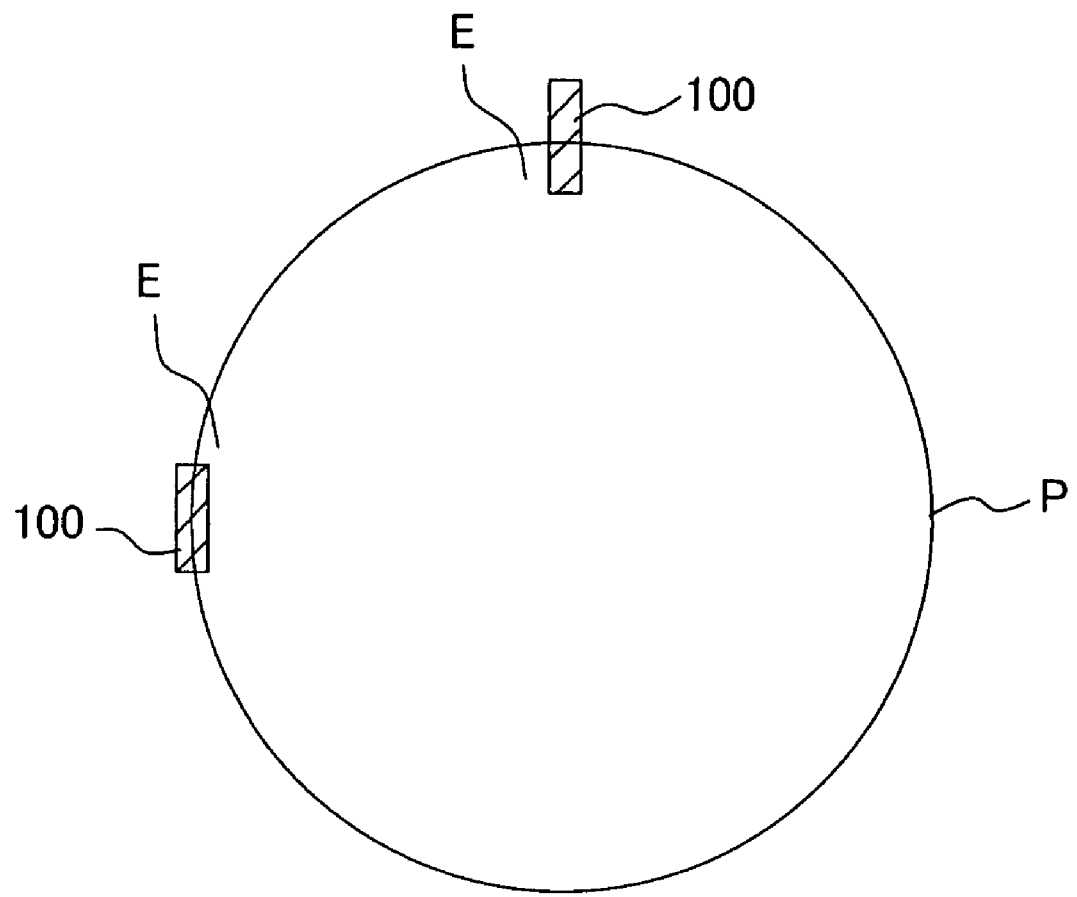
FIG. 14 illustrates the problem involved in the conventional technique.

As shown in FIG. 13, the microdevice such as the semiconductor device is produced by performing, for example, a step 201 of designing the function and the performance of the microdevice, a step 202 of manufacturing a mask (reticle) based on the designing step, a step 203 of producing a substrate as a base material for the device, an exposure process step 204 of exposing the substrate with a pattern of the mask by using the exposure apparatus EX of the embodiment described above, a step 205 of assembling the device (including a dicing step, a bonding step, and a packaging step), and an inspection step 206.

According to the present invention, even when the liquid outflows, the liquid is recovered by the recovery unit without being left to stand. Therefore, it is possible to avoid the inconvenience resulting from the outflowed liquid, and it is possible to produce the device having the high pattern accuracy.

The invention claimed is:

1. A lithographic apparatus comprising:
an illumination system which provides a beam of radiation;
a support structure which holds a patterning device;
a substrate table which holds a substrate;
a projection system which projects the patterned beam onto a target portion of the substrate;
a liquid supply system which provides an immersion liquid to a space between the substrate and the projection system such that only a localized area of the substrate is covered by the immersion liquid, the localized area having a size which is smaller than that of a surface of the substrate on which the localized area is formed;
an inlet which supplies the immersion liquid, the inlet not being provided on the substrate table; and
a first outlet which removes the immersion liquid, the first outlet being provided on the substrate table to be positioned adjacent to a periphery of the substrate; and
a second outlet which removes the immersion liquid, the second outlet being provided on the substrate table to be positioned on an outer side of the first outlet with respect to the substrate,
wherein no seal is provided to constrain the immersion liquid in the space.

2. An apparatus according to claim 1, wherein the inlet is provided above the substrate table.

3. A device manufacturing method comprising:
projecting a patterned beam of radiation onto a target portion of a substrate using a projection system;
providing an immersion liquid to a space between the substrate on a substrate table and the projection system using an inlet not provided on the substrate table such that only a localized area of the substrate is covered by the immersion liquid, the localized area having a size which is smaller than that of a surface of the substrate on which the localized area is formed;
allowing the immersion liquid to leak from the space;
removing the immersion liquid through a first outlet positioned on the substrate table; and
removing the immersion liquid through a second outlet positioned on an outer side of the first outlet with respect to the substrate.

4. A device manufacturing method according to claim 3, wherein the inlet is provided above the substrate table.

5. A lithographic apparatus comprising:
an illumination system which provides a beam of radiation;
a support structure which holds a patterning device;
a substrate table which holds a substrate;
a projection system which projects the patterned beam onto a target portion of the substrate;
a liquid supply system which provides an immersion liquid to a space between the substrate and the projection system such that only a localized area of the substrate is covered by the immersion liquid, the localized area having a size which is smaller than that of a surface of the substrate on which the localized area is formed, the liquid supply system comprising an immersion liquid inlet port provided at a boundary of the space, the immersion liquid inlet port not being provided on the substrate table;
a first immersion liquid outlet port provided on the substrate table, the first immersion liquid outlet port being positioned adjacent to an outer peripheral edge of the substrate; and
a second immersion liquid outlet port provided on the substrate table, the second immersion liquid outlet port being positioned on an outer side of the first immersion liquid outlet port with respect to the substrate,
wherein the immersion liquid is not substantially confined in the space so that immersion liquid can flow out of the space.

6. An apparatus according to claim 5, wherein the immersion liquid inlet port is provided above the substrate table.

7. A lithographic apparatus comprising:
an illuminator which provides a beam of radiation;
a support structure which holds a patterning device;
a substrate table which holds a substrate;
a projection system which projects the patterned beam onto a target portion of the substrate; and
a liquid supply system which supplies a liquid such that only a localized area of the substrate, or a localized area of the substrate and the substrate table is covered by the liquid to at least partly fill a space between the projection system and the substrate, or the substrate and the substrate table,
wherein the localized area has a size which is smaller than that of a surface of the substrate on which the localized area is formed, wherein the substrate table comprises a first collecting portion which collects the liquid, the first collecting portion being positioned adjacent to an outer peripheral edge of the substrate, and a second collecting portion which collects the liquid, the second collecting portion surrounding and spaced apart from the substrate and the first collecting portion, and wherein the second collecting portion comprises a groove recessed into an upper surface of the substrate table.

8. The apparatus of claim 7, wherein the groove forms a continuous loop.

9. A lithographic apparatus comprising:
an illuminator which provides a beam of radiation;
a support structure which holds a patterning device;
a substrate table which holds a substrate;
a projection system which projects the patterned beam onto a target portion of the substrate;
a liquid supply system which supplies a liquid such that only a localized area of the substrate, or a localized area of the substrate and the substrate table is covered by the liquid to at least partly fill a space between the projection system and the substrate, or the substrate and the substrate table, wherein the localized area has a size which is smaller than that of a surface of the substrate on which the localized area is formed, and wherein the substrate table comprises a first collecting portion which collects the liquid, the first collecting portion being positioned adjacent to an outer peripheral edge of the substrate, and a second collecting portion which collects the liquid, the second collecting portion surrounding and spaced apart from the substrate and the first collecting portion; and
a suction supply which removes liquid from at least one of the first collecting portion and the second collecting portion.

10. The apparatus of claim 9, wherein the suction supply comprises a plurality of discrete outlets.

11. The apparatus of claim 9, wherein the suction supply operates independently of the liquid supply system.

12. A lithographic apparatus comprising:
an illuminator which provides a beam of radiation;
a support structure which holds a patterning device;
a substrate table which holds a substrate;
a projection system which projects the patterned beam onto a target portion of the substrate; and
a liquid supply system which supplies a liquid to a localized area of the substrate, or the substrate and the substrate table to at least partly fill a space between the projection system and the substrate, or the substrate and the substrate table, wherein the substrate table comprises a barrier which collects liquid, the barrier surrounding and spaced apart from the substrate, wherein the barrier is positioned radially outwardly of a drainage ditch or outlet surrounding an outer peripheral edge of the substrate.

13. A lithographic apparatus comprising:
an illuminator which provides a beam of radiation;
a support structure which holds a patterning device;
a substrate table which holds a substrate;
a projection system which projects the patterned beam onto a target portion of the substrate; and
a liquid supply system which supplies a liquid such that only a localized area of the substrate, or a localized area of the substrate and the substrate table is covered by the liquid to at least partly fill a space between the projection system and the substrate, or the substrate and the substrate table,
wherein the localized area has a size which is smaller than that of a surface of the substrate on which the localized area is formed, and wherein the substrate table comprises a first collecting portion which collects the liquid, the first collecting portion being positioned adjacent to an outer peripheral edge of the substrate, and a second collecting portion which collects the liquid, the second collecting portion surrounding and spaced apart from the substrate and the first collecting portion, wherein the second collecting portion extends substantially around an outer edge or portion of the substrate table.

14. A lithographic apparatus comprising:
an illuminator which provides a beam of radiation;
a support structure which holds a patterning device;
a substrate table which holds a substrate;
a projection system which projects the patterned beam onto a target portion of the substrate; and
a liquid supply system which supplies a liquid such that only a localized area of the substrate, or a localized area of the substrate and the substrate table is covered by the liquid to at least partly fill a space between the projection system and the substrate, or the substrate and the substrate table,
wherein the localized area has a size which is smaller than that of a surface of the substrate on which the localized area is formed, and
wherein the substrate table comprises a liquid collecting portion which collects the liquid, the liquid collecting portion surrounding and spaced apart from the substrate, wherein the liquid collecting portion additionally surrounds areas of an upper surface of the substrate table which are not covered by the substrate.

15. A device manufacturing method comprising:
providing a liquid such that only a localized area of a substrate, or a localized area of the substrate and a substrate table is covered by the liquid to at least partly fill a space between a projection system and the substrate, or the substrate and the substrate table, the localized area having a size which is smaller than that of a surface of the substrate on which the localized area is formed;
projecting a patterned beam of radiation through the liquid onto a target portion of the substrate using the projection system;
collecting the liquid at an outer peripheral edge of the substrate with a first collecting portion provided on the substrate table; and
collecting the liquid at an outer side of the first collecting portion with respect to the substrate with a second collecting portion provided on the substrate table.

16. The device manufacturing method according to claim 15, further comprising:
removing the liquid from at least one of the first collecting portion and the second collecting portion using a suction supply.

17. The method of claim 16, wherein the removing of the liquid operates independently of providing the liquid.

18. A device manufacturing method comprising:
providing a liquid to a localized area of a substrate, or the substrate and a substrate table to at least partly fill a space between a projection system and the substrate, or the substrate and the substrate table;
projecting a patterned beam of radiation through the liquid onto a target portion of the substrate using the projection system;
collecting liquid with a barrier, the barrier surrounding and spaced apart from the substrate; and
removing liquid using a drainage ditch or outlet surrounding an outer peripheral edge of the substrate and positioned radially inwardly of the barrier.

* * * * *